United States Patent
Do et al.

(10) Patent No.: US 11,043,564 B2
(45) Date of Patent: Jun. 22, 2021

(54) INTEGRATED CIRCUIT DEVICES INCLUDING TRANSISTORS HAVING VARIABLE CHANNEL PITCHES

(71) Applicant: Samsung Electronics Co., Ltd., Suwon-si (KR)

(72) Inventors: Jung Ho Do, Hwaseong-si (KR); Seung Hyun Song, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/520,717

(22) Filed: Jul. 24, 2019

(65) Prior Publication Data

US 2020/0295146 A1   Sep. 17, 2020

Related U.S. Application Data

(60) Provisional application No. 62/819,152, filed on Mar. 15, 2019.

(51) Int. Cl.
| | |
|---|---|
| *H01L 29/417* | (2006.01) |
| *H01L 27/02* | (2006.01) |
| *H01L 29/78* | (2006.01) |
| *H01L 27/088* | (2006.01) |

(52) U.S. Cl.
CPC .... *H01L 29/41741* (2013.01); *H01L 27/0207* (2013.01); *H01L 27/088* (2013.01); *H01L 29/7827* (2013.01)

(58) Field of Classification Search
CPC .......... H01L 29/41741; H01L 27/0207; H01L 27/088; H01L 29/7827

USPC ........................................................ 257/329
See application file for complete search history.

(56) References Cited

U.S. PATENT DOCUMENTS

| | | | |
|---|---|---|---|
| 8,728,892 B2 | 5/2014 | Ou et al. | |
| 9,536,032 B2 | 1/2017 | Chiang et al. | |
| 9,680,473 B1 | 6/2017 | Anderson et al. | |
| 9,786,788 B1 * | 10/2017 | Anderson | H01L 29/78642 |
| 2003/0060015 A1 * | 3/2003 | Layman | H01L 21/823487 438/275 |
| 2016/0260719 A1 * | 9/2016 | Chung | H01L 27/0207 |
| 2016/0329402 A1 * | 11/2016 | Cheng | H01L 29/785 |
| 2016/0329899 A1 * | 11/2016 | Masuoka | H01L 27/1203 |
| 2018/0121593 A1 | 5/2018 | Anderson et al. | |
| 2018/0190670 A1 | 7/2018 | Ryckaert et al. | |
| 2018/0308762 A1 | 10/2018 | Anderson et al. | |

* cited by examiner

*Primary Examiner* — Dzung Tran
(74) *Attorney, Agent, or Firm* — Myers Bigel, P.A.

(57) ABSTRACT

Integrated circuit devices may include active regions spaced apart from each other in a direction. The active regions may include a first pair of active regions, a second pair of active regions, and a third pair of active regions. The first pair of active regions may be spaced apart from each other by a first distance in the direction, the second pair of active regions may be spaced apart from each other by the first distance in the direction, and the third pair of active regions may be spaced apart from each other by the first distance in the direction. The second pair of active regions may be spaced apart from the first pair of active regions and the third pair of active regions by a second distance in the direction, and the first distance may be shorter than the second distance.

20 Claims, 42 Drawing Sheets

FIG. 9A
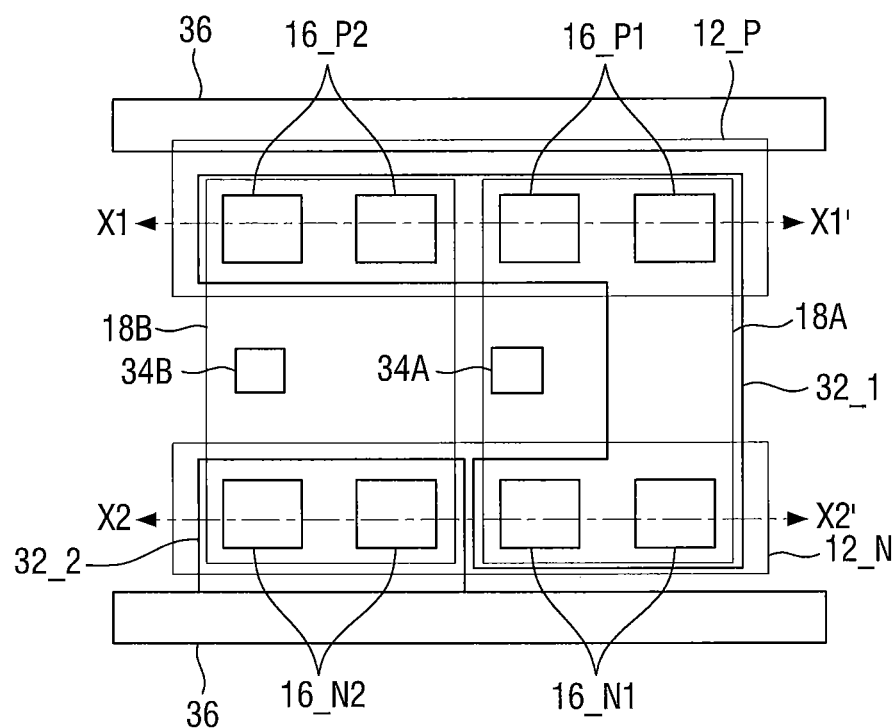
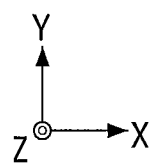

FIG. 12B
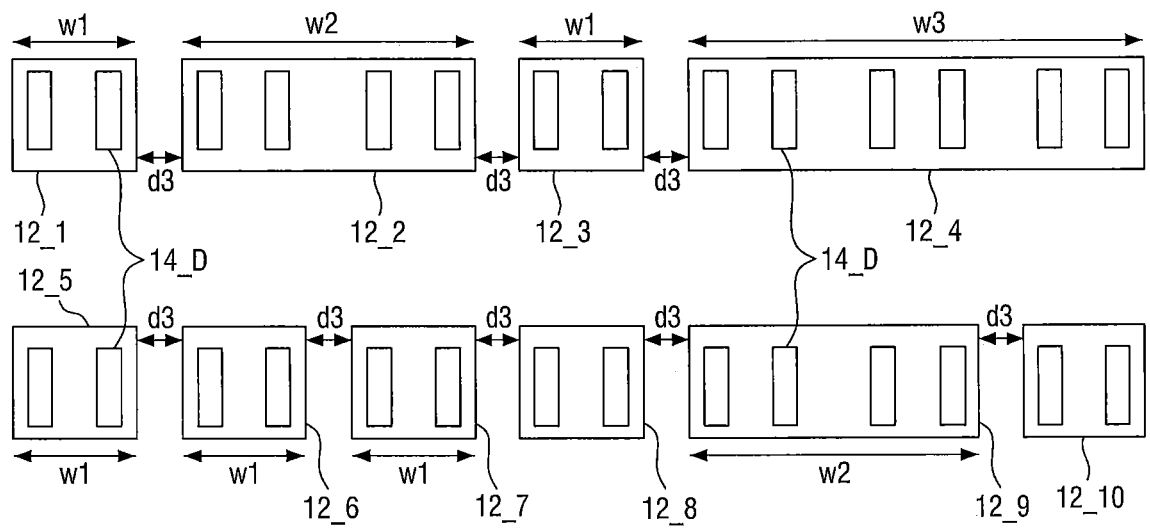
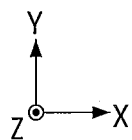

FIG. 12C
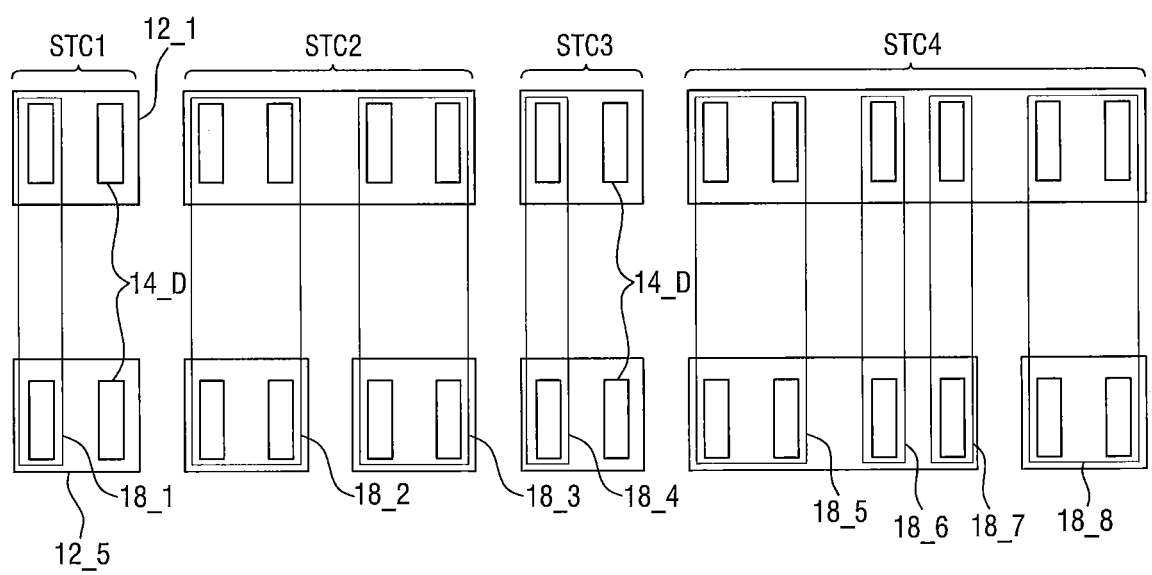
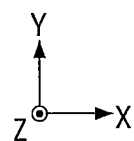

FIG. 13
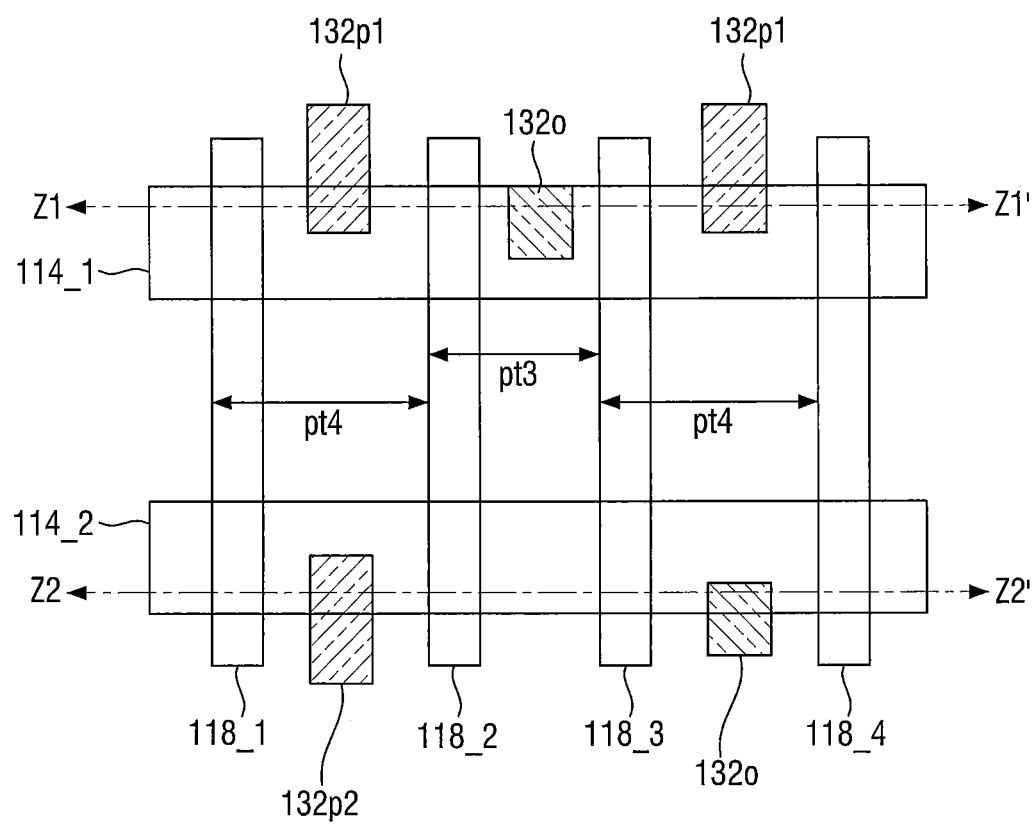
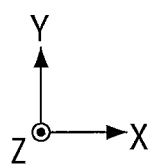

INTEGRATED CIRCUIT DEVICES INCLUDING TRANSISTORS HAVING VARIABLE CHANNEL PITCHES

CROSS-REFERENCE TO RELATED APPLICATION

This application claims priority to U.S. Provisional Application Ser. No. 62/819,152, entitled VFET STANDARD CELL WITH VARIABLE FIN PITCH, filed in the USPTO on Mar. 15, 2019, the disclosure of which is hereby incorporated by reference herein in its entirety.

FIELD

The present disclosure generally relates to the field of electronics and, more particularly, to integrated circuit devices.

BACKGROUND

Transistors having different structures and different layouts have been researched to increase the integration density of integrated circuit devices. For example, vertical field-effect transistor (VFET) devices have been researched because of their high scalability.

SUMMARY

According to some embodiments of the present inventive concept, integrated circuit devices may include standard cells may include a plurality of active regions spaced apart from each other in a first direction. Each of the plurality of active regions may protrude from an upper surface of a substrate. The plurality of active regions may include a first pair of active regions, a second pair of active regions, and a third pair of active regions, and the first pair of active regions, the second pair of active regions, and the third pair of active regions may be spaced apart from each other in the first direction and are sequentially arranged along the first direction. The first pair of active regions may be spaced apart from each other by a first distance in the first direction, the second pair of active regions may be spaced apart from each other by the first distance in the first direction, and the third pair of active regions may be spaced apart from each other by the first distance in the first direction. The first pair of active regions may be spaced apart from the second pair of active regions by a second distance in the first direction, and the second pair of active regions may be spaced apart from the third pair of active regions by the second distance in the first direction, and the first distance may be shorter than the second distance.

According to some embodiments of the present inventive concept, integrated circuit devices may include a bottom source/drain region on a substrate, a first active region and a second active region spaced apart from each other in a first direction, and a gate structure on a side of the first active region. Each of the first active region and the second active region may protrude from an upper surface of the substrate, the first active region and the second active region may be in the bottom source/drain region in a plan view, and the second active region may be a dummy active region.

According to some embodiments of the present inventive concept, integrated circuit devices may include a plurality of active regions including a first pair of active regions and a second pair of active regions. The first pair of active regions may be spaced apart from each other in a first direction, and the second pair of active regions may be spaced apart from each other in the first direction. The first pair of active regions and the second pair of active regions may be spaced apart from each other in a second direction that is different from the first direction, and each of the first pair of active regions may have a linear shape extending longitudinally in the second direction. Each of the second pair of active regions may have a main portion having a linear shape extending longitudinally in the second direction and a protruding portion protruding from the main portion.

BRIEF DESCRIPTION OF THE DRAWINGS

FIGS. 9A and 9B are layouts of the 2-input NAND gate of FIG. 8, according to some embodiments.

FIGS. 12A, 12B, and 12C show layouts of a portion of an integrated circuit device according to some embodiments.

FIGS. 13 and 15 are layouts of the 2-input NAND gate of FIG. 8 according to some embodiments.

DETAILED DESCRIPTION

According to some embodiments of the present inventive concept, a single integrated circuit device (e.g., a single chip) may include multiple standard cells therein. The standard cell may be, for example, an inverter, a 2-input NAND gate, a 3-input NAND gate, a 2-input NOR, a 3-input NOR, an And-Or inverter (AOI), an Or-And inverter (OAI), an XNOR gate, an XOR gate, a multiplexer (MUX), a latch, or a D-flip-flop. In some embodiments, a single integrated circuit device may include multiple portions (e.g., units) having different functions (e.g., a Central Processing Unit (CPU) portion, an Application Processor (AP) portion, and a Micro Processing Unit (MPU) portion). Each of these multiple portions may include multiple standard cells therein.

According to some embodiments of the present inventive concept, active regions of transistors (e.g., channel regions) have variable pitches to increase the integration density of an integrated circuit device. In some embodiments, transistors included in an integrated circuit device may be vertical field effect transistors (VFET) that include active regions vertically protruding from a substrate. In some embodiments, each of the active regions may have non-linear shapes in a plan view. For example, each of the active regions may include a main portion having a linear shape and a protruding portion protruding from the main portion. It will be understood that "active regions" refer to regions in which channels are formed when transistors are turn on. Accordingly, it will be also understood that "active regions" may be interchangeable with "channel regions."

Figure 1:
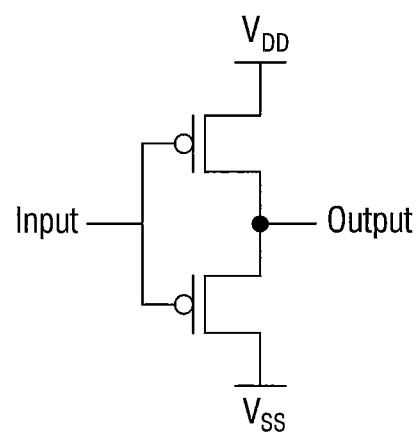
FIG. 1 is a circuit diagram of an inverter, according to some embodiments.

According to some embodiments of the present inventive concept, a standard cell may be an inverter. FIG. 1 is a circuit diagram of an inverter, according to some embodiments. Referring to FIG. 1, a drain voltage $V_{DD}$ may be applied to a P-type VFET, and a source voltage $V_{SS}$ may be applied to an N-type VFET.

Figure 2A:
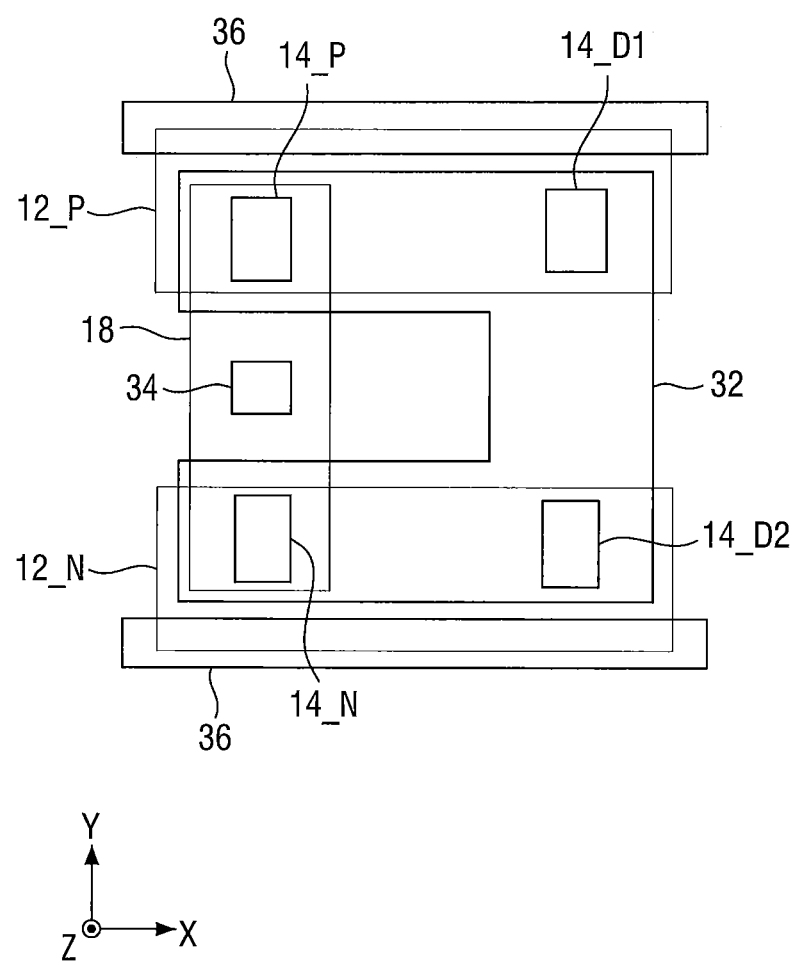
FIGS. 2A and 2B show layouts of the inverter of FIG. 1 according to some embodiments.
Figure 2B:
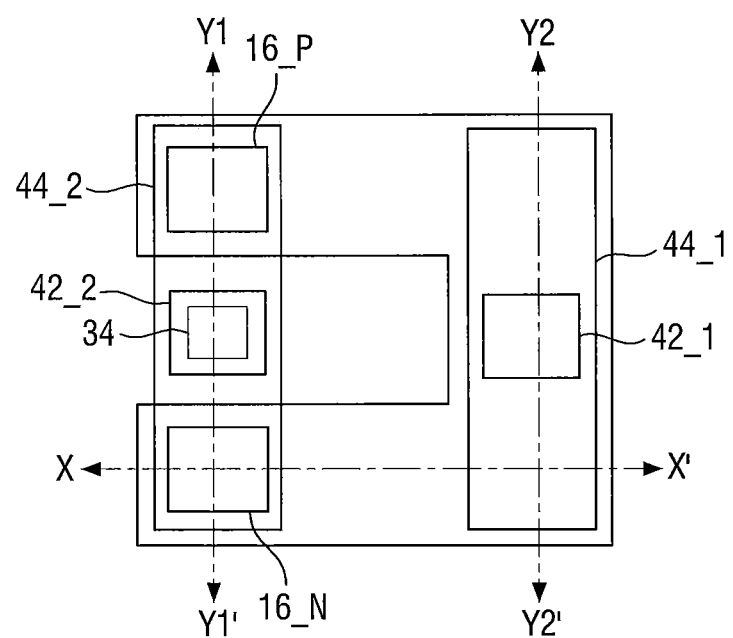

FIGS. 2A and 2B show layouts of the inverter of FIG. 1 according to some embodiments. FIGS. 2A and 2B show the layouts of the same region of the inverter, and each of FIGS. 2A and 2B shows a group of elements, rather than all elements, to simplify these drawings.

Figure 3A:
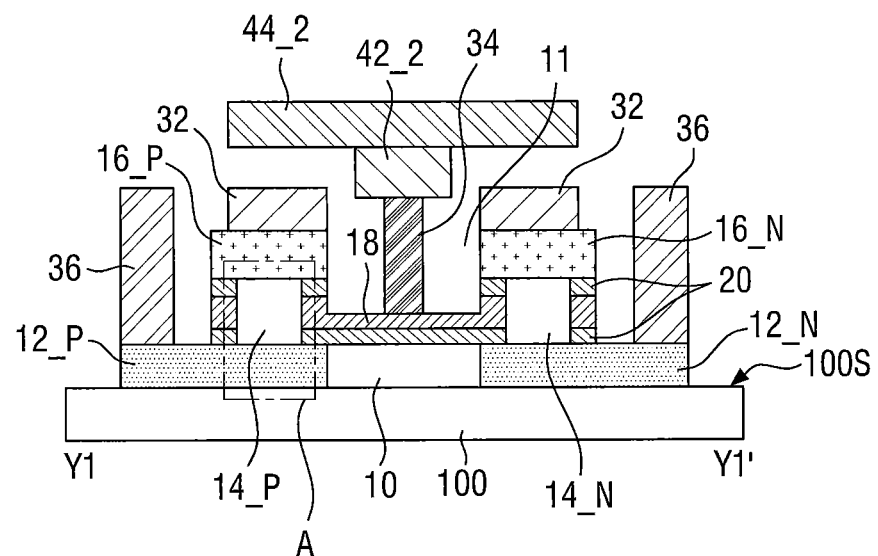
FIGS. 3A, 3B, and 3C are cross-sectional views taken along the lines Y1-Y1', Y2-Y2', and X-X' of FIG. 2B, respectively, according to some embodiments.
Figure 3B:
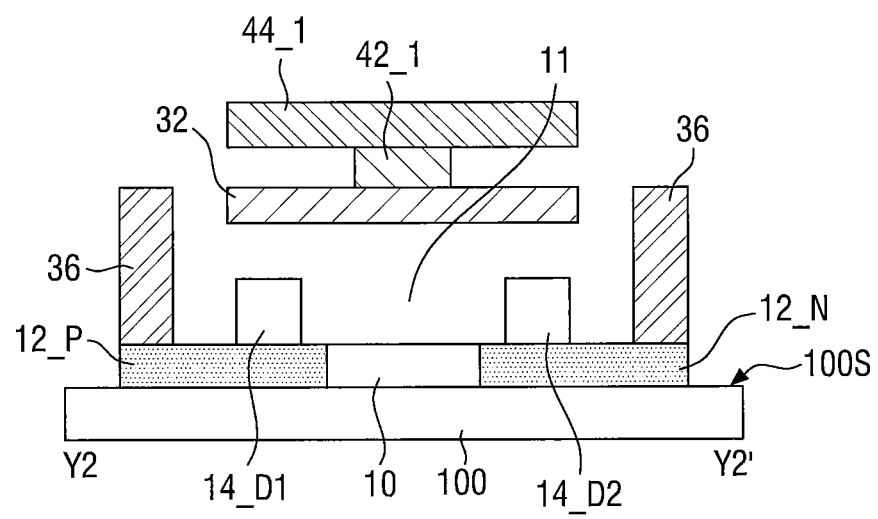
Figure 3C:
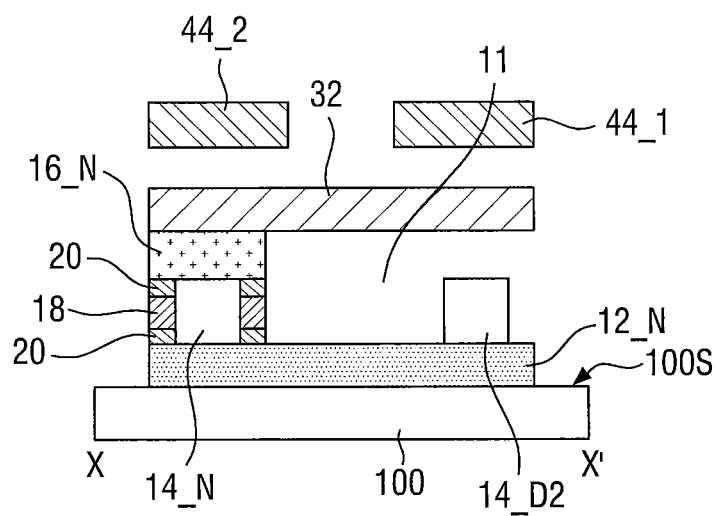
Figure 4A:
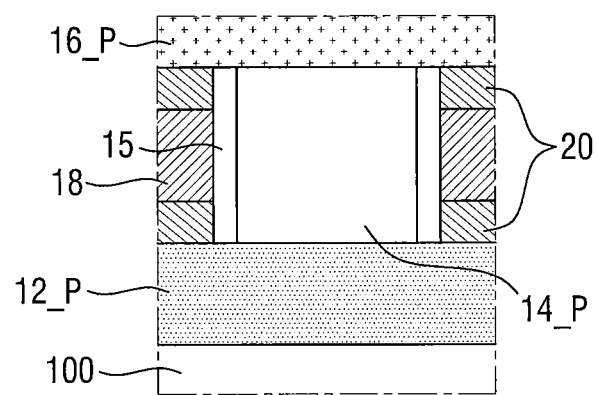
FIGS. 4A and 4B are enlarged views of the region A of FIG. 3A, according to some embodiments.
Figure 4B:
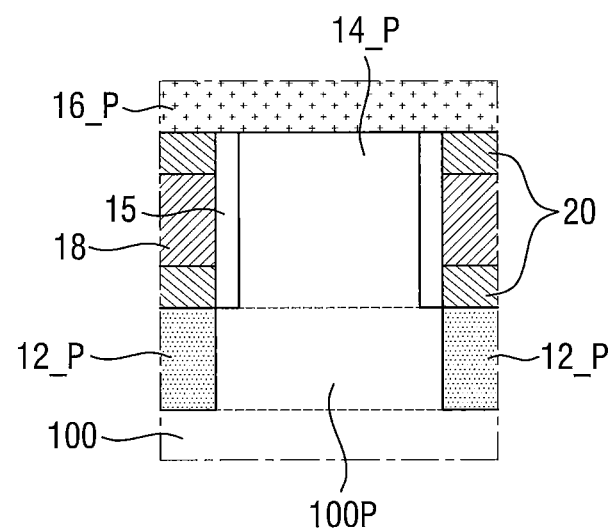

FIGS. 3A, 3B, and 3C are cross-sectional views taken along the lines Y1-Y1', Y2-Y2', and X-X' of FIG. 2B, respectively, according to some embodiments. FIGS. 4A and 4B are enlarged views of the region A of FIG. 3A, according to some embodiments.

Referring to FIGS. 2A through 3C, the inverter may include a P-type VFET and an N-type VFET. The P-type VFET may include a first bottom source/drain region 12_P, a first channel region 14_P, a first top source/drain region 16_P, and the N-type VFET may include a second bottom source/drain region 12_N, a second channel region 14_N, a second top source/drain region 16_N. In some embodiments, each of the first bottom source/drain region 12_P and the second bottom source/drain region 12_N may extend longitudinally in a first horizontal direction X as shown in FIG. 2A. The first horizontal direction X may be parallel to an upper surface 100S of a substrate 100.

The first channel region 14_P and the first top source/drain region 16_P may be sequentially stacked on the substrate 100 in a vertical direction Z, and the second channel region 14_N and the second top source/drain region 16_N may be sequentially stacked on the substrate 100 in the vertical direction Z. The vertical direction Z may be perpendicular to the upper surface 100S of the substrate 100. In some embodiments, the P-type VFET and the N-type VFET may be spaced part from each other in a second horizontal direction Y that may be perpendicular to the vertical direction Z. In some embodiments, the second horizontal direction Y may also be perpendicular to the first horizontal direction X.

The inverter may include a common gate layer 18. A first portion of the common gate layer 18 may be a gate electrode of the P-type VFET and a second portion of the common gate layer 18 may be a gate electrode of the N-type VFET. As the P-type VFET and the N-type VFET share the common gate layer 18, the same input may be applied to the P-type VFET and the N-type VFET as a gate input. Spacers 20 may be provided to electrically isolate the common gate layer 18 from the first and second bottom source/drain regions 12_P and 12_N and from the first and second top source/drain regions 16_P and 16_N. The first and second bottom source/drain regions 12_P and 12_N may be electrically isolated from each other by an isolation layer 10 (e.g., a shallow trench isolation layer).

As the common gate layer 18 is the gate electrode of the P-type VFET and the gate electrode of the N-type VFET, it will be understood that the common gate layer 18 is operatively connected to the first channel region 14_P of the P-type VFET and the second channel region 14_N of the N-type VFET. It will be understood that references herein to "an element A being operatively connected to an element B" (or similar language) means that the element A is connected to (e.g., directly or indirectly connected to) the element B to producing an appropriate effect. For example, the common gate layer 18 is operatively connected to the first channel region 14_P of the P-type VFET and the second channel region 14_N of the N-type VFET as the common gate layer 18 is connected to the first channel region 14_P of the P-type VFET and the second channel region 14_N of the N-type VFET to induce channel formation in the first channel region 14_P of the P-type VFET and the second channel region 14_N of the N-type VFET.

A top contact layer 32 may be on the P-type VFET and the N-type VFET and may contact both the first top source/drain region 16_P and the second top source/drain region 16_N. The top contact layer 32 may include metal, for example, cobalt (Co), tungsten (W), and/or copper (Cu). The first top source/drain region 16_P and the second top source/drain region 16_N may be electrically connected to each other through the top contact layer 32.

A first via contact 42_1 and a first conductive line 44_1 may be sequentially stacked on the top contact layer 32. In some embodiments, the first via contact 42_1 may contact the top contact layer 32, and the first conductive line 44_1 may contact the first via contact 42_1, as illustrated in FIG. 3B. In some embodiments, the top contact layer 32 may be connected to an output node of the inverter through the first via contact 42_1 and the first conductive line 44_1. Each of the first via contact 42_1 and the first conductive line 44_1 may include metal, for example, Cu and/or Co. In some embodiments, the first conductive line 44_1 may be a metal line that is closest to the substrate 100 in the vertical direction Z and may be referred to as a first metal line used for routing.

Referring to FIG. 2B, in some embodiments, each of first and second conductive lines 44_1 and 44_2 may extend longitudinally in the second horizontal direction Y, and the first and second conductive lines 44_1 and 44_2 may be spaced apart from each other in the first horizontal direction X.

A gate contact 34 may contact the common gate layer 18. In some embodiments, a portion of the common gate layer 18 may be exposed by the spacer 20 and may be contacted by the gate contact 34, as illustrated in FIG. 3A. The gate contact 34 may include metal, for example, Co, W, and/or Cu. In some embodiments, the gate contact 34 may be spaced apart from each of the first top source/drain region 16_P and the second top source/drain region 16_N in the second horizontal direction Y, as illustrated in FIG. 2A.

A second via contact 42_2 and a second conductive line 44_2 may be sequentially stacked on the gate contact 34, as illustrated in FIG. 3A. In some embodiments, the second via contact 42_2 may contact the gate contact 34, and the second conductive line 44_2 may contact the second via contact 42_2, as illustrated in FIG. 3A. In some embodiments, an input of the inverter may be applied to the common gate layer 18 through the second conductive line 44_2, the second via contact 42_2, and the gate contact 34.

In some embodiments, the inverter may include first and second bottom contacts 36 as illustrated in FIG. 2A. The first bottom contact 36 may contact the first bottom source/drain region 12_P, and the second bottom contact 36 may contact the second bottom source/drain region 12_N, as illustrated in FIGS. 3A and 3B. In some embodiments, a first power having a first voltage (e.g., a drain voltage $V_{DD}$) may be applied to the first bottom source/drain region 12_P through the first bottom contact 36, and a second power having a second voltage (e.g., a source voltage $V_{SS}$) may be applied to the second bottom source/drain region 12_N through the second bottom contact 36. For example, the first and second bottom contacts 36 may include metal, for example, Co, W, and/or Cu.

Referring to FIGS. 2A and 3B, the inverter may further include a first dummy channel region 14_D1 and a second dummy channel region 14_D2. The first dummy channel region 14_D1 and the first channel region 14_P may be spaced apart from each other in the first horizontal direction X and may be arranged along the first horizontal direction X. The second dummy channel region 14_D2 and the second channel region 14_N may be spaced apart from each other in the first horizontal direction X and may be arranged along the first horizontal direction X. The common gate layer 18 may be spaced apart from the first dummy channel region 14_D1 and the second dummy channel region 14_D2, and thus the common gate layer 18 may not be operatively connected to the first dummy channel region 14_D1 and the second dummy channel region 14_D2. It will be understood that references herein to "an element A and an element B that are arranged along a direction C" (or similar language) may mean that the element A and the element B are aligned with each other along the direction C.

In some embodiments, the first dummy channel region 14_D1 may be in the first bottom source/drain region 12_P in a plan view, and the second dummy channel region 14_D2 may be in the second bottom source/drain region 12_N in the plan view as shown in FIG. 2A. In some embodiments, in the plan view, the first bottom source/drain region 12_P may surround (e.g., partially or completely) the first dummy channel region 14_D1, and the second bottom source/drain region 12_N may surround (e.g., partially or completely) the second dummy channel region 14_D2.

Referring to FIGS. 3A, 3B, and 3C, the inverter may also include an interlayer insulating layer 11, and the first dummy channel region 14_D1 and the second dummy channel region 14_D2 may be in the interlayer insulating layer 11. In some embodiments, the interlayer insulating layer 11 may contact sides and upper surfaces of the first dummy channel region 14_D1 and the second dummy channel region 14_D2, as illustrated in FIG. 3B.

A "dummy channel region" herein refers to a region that may have a shape similar to channel regions (e.g., the first channel region 14_P and the second channel region 14_N) and/or may have a material similar to a material of the channel regions but is not used as a channel region. In some embodiments, the first dummy channel region 14_D1 and the second dummy channel region 14_D2 may be formed of an insulating material.

Referring to FIGS. 4A and 4B, a gate insulator 15 may be disposed between the first channel region 14_P and the common gate layer 18 to electrically isolate the first channel region 14_P and the common gate layer 18. Although FIGS. 4A and 4B show that the gate insulator 15 is also between the spacer 20 and the first channel region 14_P, it will be understood that the gate insulator 15 can be omitted between the spacer 20 and the first channel region 14_P, and the spacer 20 may contact the first channel region 14_P.

In some embodiments, a lower surface of the first channel region 14_P may overlap the first bottom source/drain region 12_P, as illustrated in FIG. 4A. In some embodiments, the lower surface of the first channel region 14_P may be connected to the substrate 100 through a protruding portion 100P of the substrate 100, and the first bottom source/drain region 12_P may be on a side of the protruding portion 100P of the substrate 100 as illustrated in FIG. 4B. Although only the P-type VFET is illustrated in FIGS. 4A and 4B, it will be understood that all VFETs including the N-type VFET in FIGS. 3A through 3C can have a structure the same as or similar to the P-type VFET.

As the gate insulator 15 and the common gate layer 18 are collectively used as a gate of each of the P-type VFET and the N-type VFET, the gate insulator 15 and the common gate layer 18 may be collectively referred to as a gate structure. In some embodiments, the gate structure may contact sides of the first channel region 14_P and the second channel region 14_N, as illustrated in FIG. 3A.

Referring again to FIGS. 2A and 2B, in some embodiments, the first via contact 42_1 contacting the top contact layer 32 and the second via contact 42_2 contacting the gate contact 34 may be spaced apart from each other in the first horizontal direction X and may be arranged along the first horizontal direction X.

Figure 5:
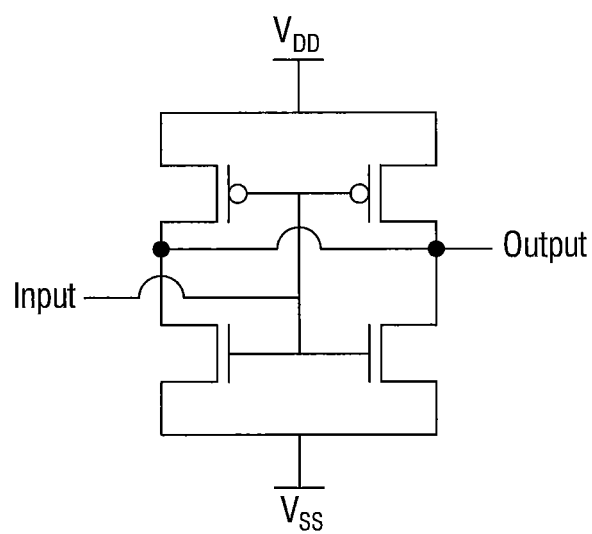
FIG. 5 is a circuit diagram of an inverter, according to some embodiments.

According to some embodiments, the standard cell may be an inverter shown in FIG. 5. FIG. 5 is a circuit diagram of an inverter, according to some embodiments. Referring to FIG. 5, in some embodiments, an inverter may include two P-type VFETs connected in parallel and two N-type VFETs connected in parallel for better performance (e.g., higher current) compared with an inverter including a single P-type VFET and a single N-type VFET (e.g., the inverter shown in FIG. 1).

Figure 6A:
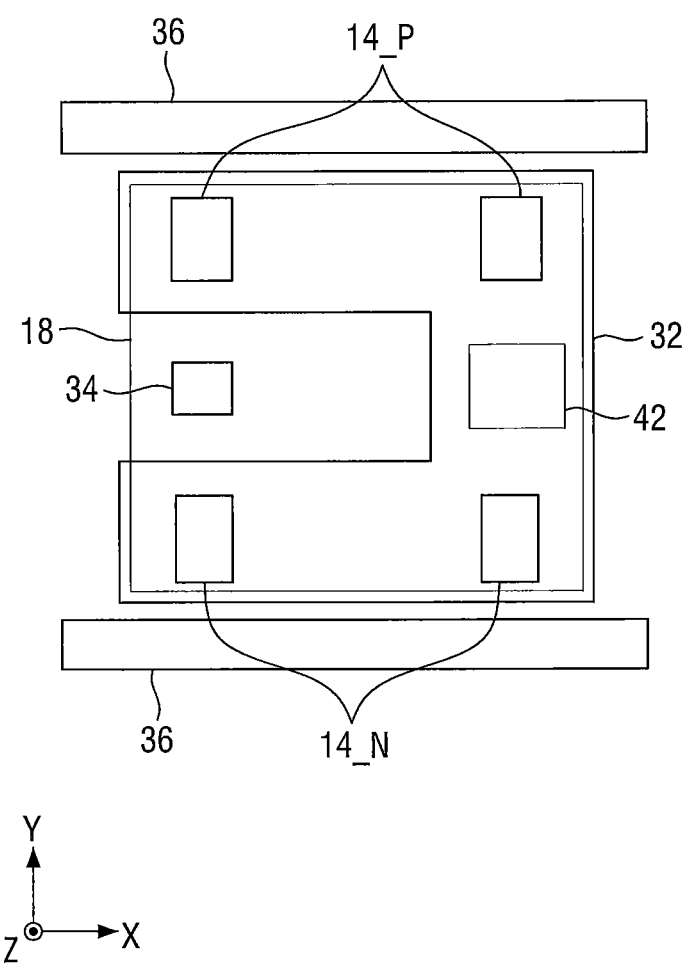
FIGS. 6A and 6B are layouts of the inverter of FIG. 5, according to some embodiments.
Figure 6B:
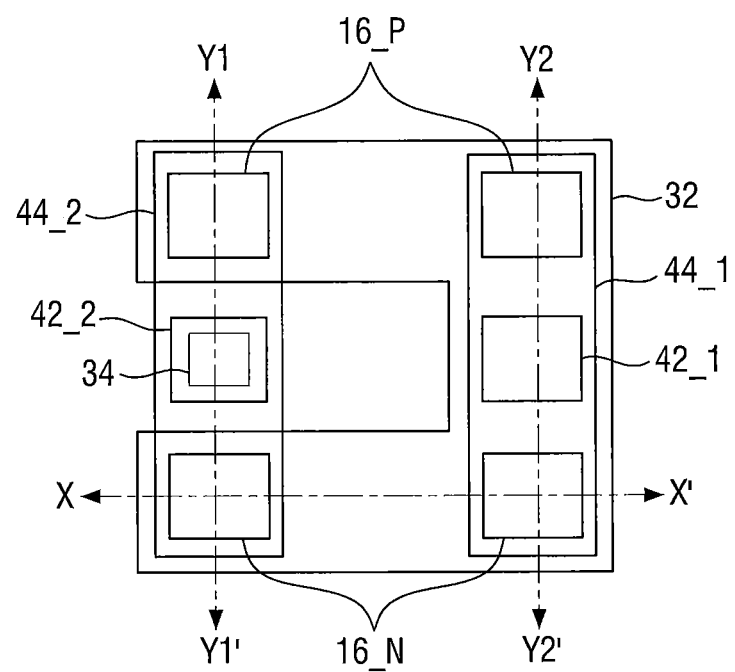

FIGS. 6A and 6B are layouts of the inverter of FIG. 5, according to some embodiments. Each of FIGS. 6A and 6B shows a group of elements, rather than all elements, to simplify these drawings. FIGS. 6A and 6B do not show some elements (e.g., the first and second bottom source/drain regions 12_P and 12_N in FIG. 2A) shown in FIGS. 2A and 2B to simplify these drawings.

Figure 7A:
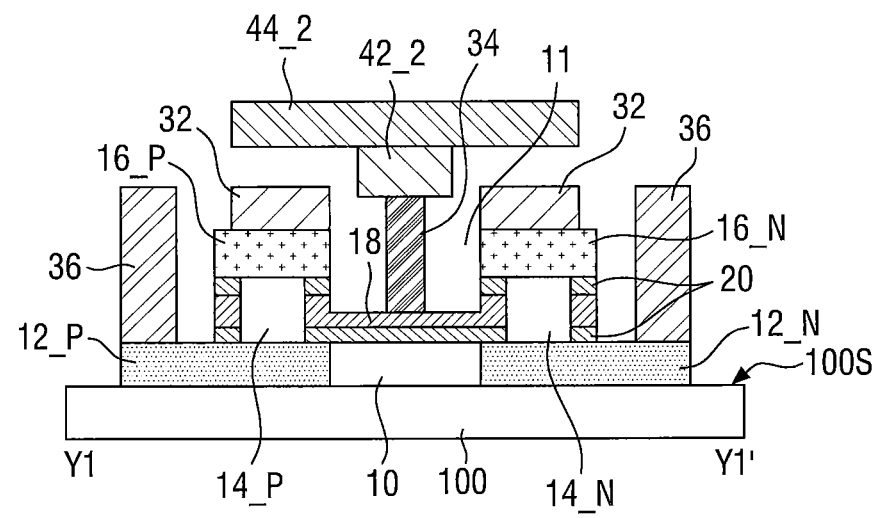
FIGS. 7A, 7B, and 7C are cross-sectional views taken along the lines Y1-Y1', Y2-Y2', and X-X' of FIG. 6B, respectively.
Figure 7B:
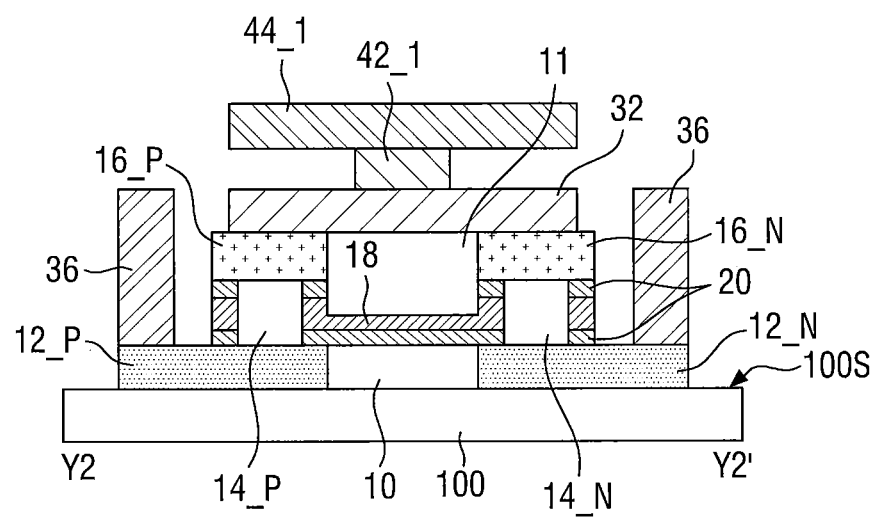
Figure 7C:
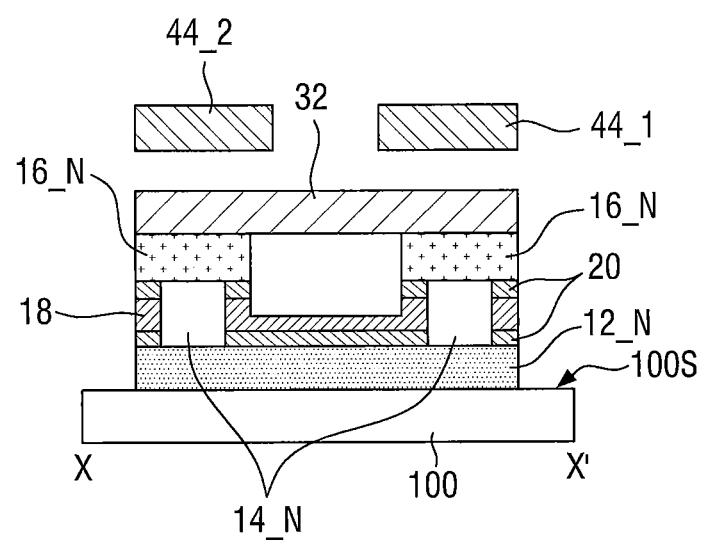

FIGS. 7A, 7B, and 7C are cross-sectional views taken along the lines Y1-Y1', Y2-Y2', and X-X' of FIG. 6B, respectively. It will be understood that FIG. 7A is the same as or similar to FIG. 3A.

Referring to FIG. 6A, in some embodiments, a first portion of the common gate layer 18 may be a gate electrode of a first one of two P-type VFETs (i.e., a first P-type VFET), a second portion of the common gate layer 18 may be a gate electrode of a second one of two P-type VFETs (i.e., a second P-type VFET), a third portion of the common gate layer 18 may be a gate electrode of a first one of the two N-type VFETs (i.e., a first N-type VFET), and a fourth portion of the common gate layer 18 may be a gate electrode of a second one of the two N-type VFETs (i.e., a second N-type VFET). As the two P-type VFETs and the two N-type VFETs share the common gate layer 18, the same input may be applied to the two P-type VFETs and the two N-type VFETs as a gate input.

In some embodiments, as illustrated in FIGS. 6A and 7B, the first via contact 42_1 contacting the top contact layer 32 may be spaced apart from each of the first top source/drain region 16_P and the second top source/drain region 16_N in the second horizontal direction Y.

Referring to FIGS. 6A and 7A through 7C, the top contact layer 32 may contact two first top source/drain regions 16_P and two second top source/drain regions 16_N, and thus all of the two first top source/drain regions 16_P and the two second top source/drain regions 16_N may be electrically connected through the top contact layer 32.

Figure 8:
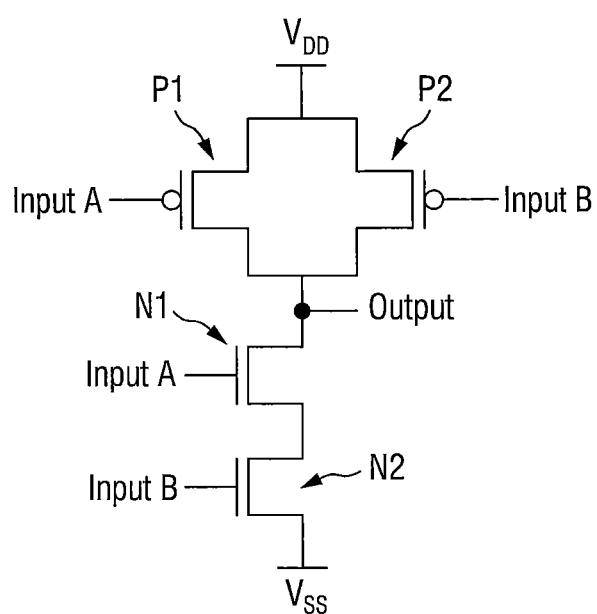
FIG. 8 is a circuit diagram of a 2-input NAND gate, according to some embodiments.

FIG. 8 is a circuit diagram of a 2-input NAND gate, according to some embodiments. According to some embodiments, the standard cell may be a 2-input NAND gate shown in FIG. 8. The 2-input NAND gate of FIG. 8 may include a first P-type VFET P1 and a first N-type VFET N1 connected to each other the same as the circuit shown in FIG. 1. Specifically, the first P-type VFET P1 and the first N-type VFET N1 may share a first input (e.g., Input A) and an output (e.g., Output). The 2-input NAND gate may also include a second P-type VFET P2 and a second N-type VFET N2, which share a second input (e.g., Input B).

Figure 9B:
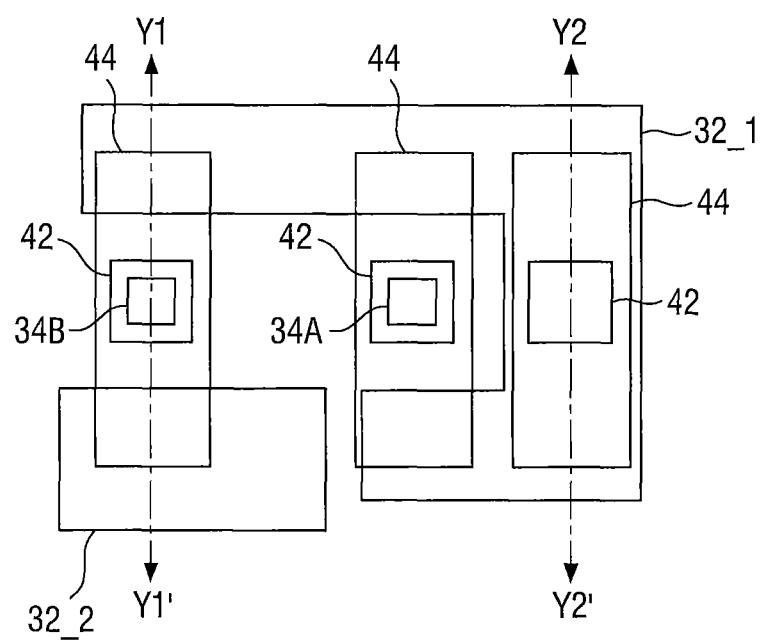

FIGS. 9A and 9B are layouts of the 2-input NAND gate of FIG. 8, according to some embodiments. FIGS. 9A and 9B show the layouts of the same region of the 2-input NAND gate, and each of FIGS. 9A and 9B shows a group of elements, rather than all elements, to simplify these drawings.

Figure 10A:
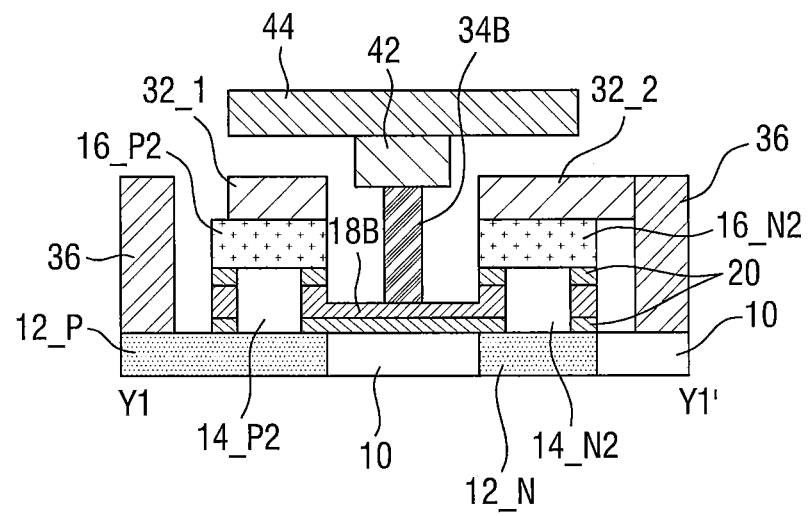
FIGS. 10A and 10B are cross-sectional views taken along the lines Y1-Y1' and Y2-Y2' of FIG. 9B, respectively.
Figure 10B:
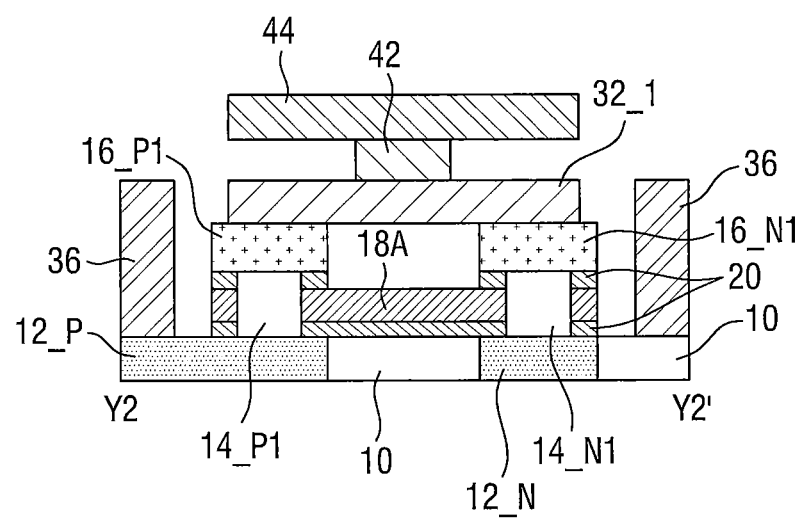
Figure 10C:
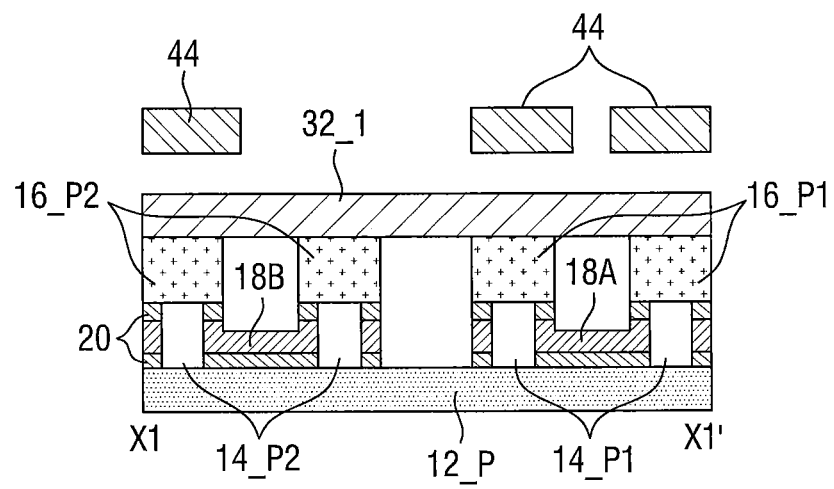
FIGS. 10C and 10D are cross-sectional views taken along the lines X1-X1' and X2-X2' of FIG. 9A, respectively.
Figure 10D:
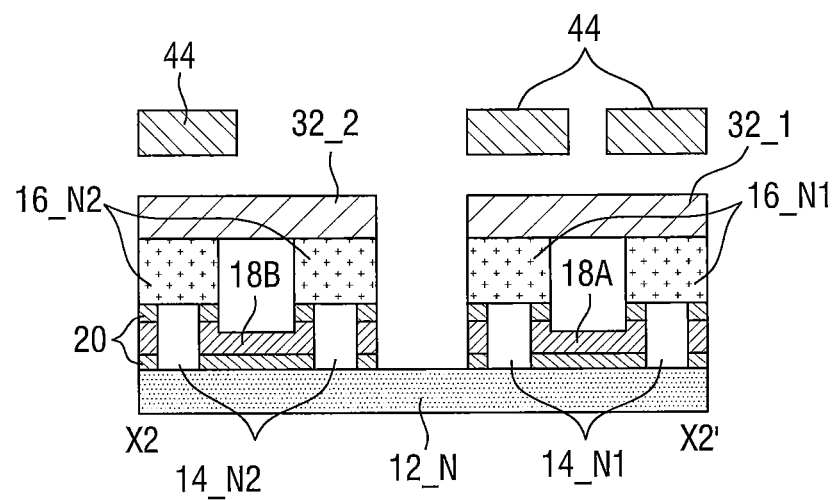

FIGS. 10A and 10B are cross-sectional views taken along the lines Y1-Y1' and Y2-Y2' of FIG. 9B, respectively, and FIGS. 10C and 10D are cross-sectional views taken along the lines X1-X1' and X2-X2' of FIG. 9A, respectively.

Although FIGS. 9A through 10D illustrate each of the transistors (i.e., the first P-type VFET P1, the first N-type VFET N1; the second P-type VFET P2, and the second N-type VFET N2) includes two transistors for better performance, it will be understood that each of the transistors may include a single transistor. To simplify drawings, the substrate 100 is not shown in FIGS. 10A through 10D.

Referring to FIGS. 9A through 10D, the first P-type VFET P1 may include two first P-type VFETs. Each of the two first P-type VFETs may include a first bottom source/drain region 12_P, a first channel region 14_P1, and a first top source/drain region 16_P1. The first N-type VFET N1 may include two first N-type VFETs. Each of the two first N-type VFETs may include a second bottom source/drain region 12_N, a second channel region 14_N1, and a second top source/drain region 16_N1. The second P-type VFET P2 may include two second P-type VFETs. Each of the two second P-type VFETs may include the first bottom source/drain region 12_P, a third channel region 14_P2, and a third top source/drain region 16_P2. The first bottom source/drain region 12_P may be shared by the two first P-type VFETs and the two second P-type VFETs. The second N-type VFET N2 may include two second N-type VFETs. Each of the two second N-type VFETs may include the second bottom source/drain region 12_N, a fourth channel region 14_N2, and a fourth top source/drain region 16_N2. The second bottom source/drain region 12_N may be shared by the two first N-type VFETs and the two second N-type VFETs.

The 2-input NAND gate may include a first common gate layer 18A. A first portion of the first common gate layer 18A may be a gate electrode of each of the two first P-type VFETs P1, and a second portion of the first common gate layer 18A may be a gate electrode of the two first N-type VFETs N1. As the two first P-type VFETs P1 and the two first N-type VFETs N1 share the first common gate layer 18A, the same input (e.g., Input A in FIG. 8) may be applied to the two first P-type VFETs P1 and the two first N-type VFETs N1 as a gate input. Spacers 20 may be provided to electrically isolate the first common gate layer 18A from the first and second bottom source/drain regions 12_P and 12_N and from the first and second top source/drain regions 16_P1 and 16_N1. The first and second bottom source/drain regions 12_P and 12_N may be electrically isolated from each other by an isolation layer 10 (e.g., a shallow trench isolation layer).

The 2-input NAND gate may also include a second common gate layer 18B. A first portion of the second common gate layer 18B may be a gate electrode of each of the two second P-type VFETs P2, and a second portion of the second common gate layer 18B may be a gate electrode of the two second N-type VFETs N2. As the two second P-type VFETs P2 and the two second N-type VFETs N2 share the second common gate layer 18B, the same input (e.g., Input B in FIG. 8) may be applied to the two second P-type VFETs P2 and the two second N-type VFETs N2 as a gate input. Spacers 20 may be provided to electrically isolate the second common gate layer 18B from the first and second bottom source/drain regions 12_P and 12_N and from the third and fourth top source/drain regions 16_P2 and 16_N2.

A first top contact layer 32_1 may extend on the two first P-type VFETs P1, the two first N-type VFETs N1, and the two second P-type VFETs P2. The first top contact layer 32_1 may contact and may electrically connect the two first top source/drain regions 16_P1, the two second top source/drain regions 16_N1, and the two third top source/drain regions 16_P2. The first top contact layer 32_1 may include metal, for example, Co, W, and/or Cu. The first top contact layer 32_1 may not overlap and may be spaced apart from the two fourth top source/drain regions 16_N2, as illustrated in FIGS. 9A and 10D.

A second top contact layer 32_2 may extend on the two second N-type VFETs N2 and may contact the two fourth top source/drain regions 16_N2. In some embodiments, as illustrated in FIGS. 9A and 10A, the second top contact layer 32_2 may extend toward and contact the bottom contact 36 adjacent the two second N-type VFETs N2 such that a source voltage $V_{SS}$ may be applied to the two fourth top source/drain regions 16_N2 through the bottom contact 36 and the second top contact layer 32_2. The second top contact layer 32_2 may include metal, for example, Co, W, and/or Cu.

The 2-input NAND gate may also include a first gate contact 34A and a second gate contact 34B. The first gate contact 34A may contact the first common gate layer 18A, and the second gate contact 34B may contact the second common gate layer 18B. In some embodiments, the first gate contact 34A and the second gate contact 34B may be spaced apart from each other in the first horizontal direction X and may be arranged along the first horizontal direction X, as illustrated in FIGS. 9A and 9B. In some embodiments, the first gate contact 34A and the second gate contact 34B may be aligned along the first horizontal direction X.

The 2-input NAND gate may include multiple via contacts 42. A first one of the via contacts 42 may contact the first gate contact 34A, a second one of the via contacts 42 may contact the second gate contact 34B, and a third one of the via contacts 42 may contact the first top contact layer 32_1. The first, second and third ones of the via contacts 42 may be spaced apart from each other in the first horizontal direction X and may be arranged along the first horizontal direction X, as illustrated in FIG. 9B. The first, second and third ones of the via contacts 42 may be aligned along the first horizontal direction X. The 2-input NAND gate may include multiple conductive lines 44, and each of the conductive lines 44 may contact a respective one of the first, second and third ones of the via contacts 42.

Figure 11:
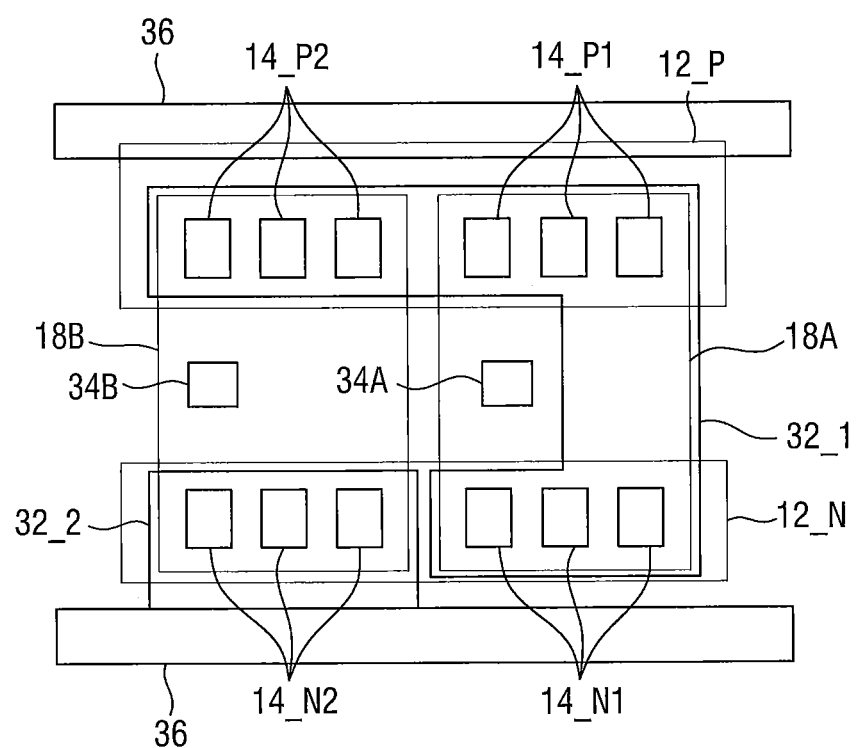
FIG. 11 is a layout of the 2-input NAND gate of FIG. 8, according to some embodiments.

FIG. 11 is a layout of the 2-input NAND gate of FIG. 8, according to some embodiments. According to FIG. 11, the 2-input NAND gate may include a first P-type VFET P1 including three first channel regions 14_P1, a first N-type VFET N1 including three second channel regions 14_N1, a second P-type VFET P2 including three third channel regions 14_P2, and a second N-type VFET N2 including three fourth channel regions 14_N2.

It will be understood that if multiple channel regions are used for a single transistor as described with reference to FIGS. 5, 9A, 9B, and 11, channel current of the single transistor may increase but an area occupied by the single transistor may also increase. Accordingly, the integration density of an integrated device including the single transistor may decrease. Therefore, in some embodiments, only a portion of an integrated device may include transistors, each of which include multiple channel regions. For example, a standard cell may include an inverter connected to an output node, and only the inverter may include transistors, each of which includes multiple channel regions and each of other transistors may include a single channel region therein. The standard cell may be, for example, a 2-OR into 2-AND gate (AO22), a 2-way multiplexer, or 2-NAND gate.

Figure 12A:
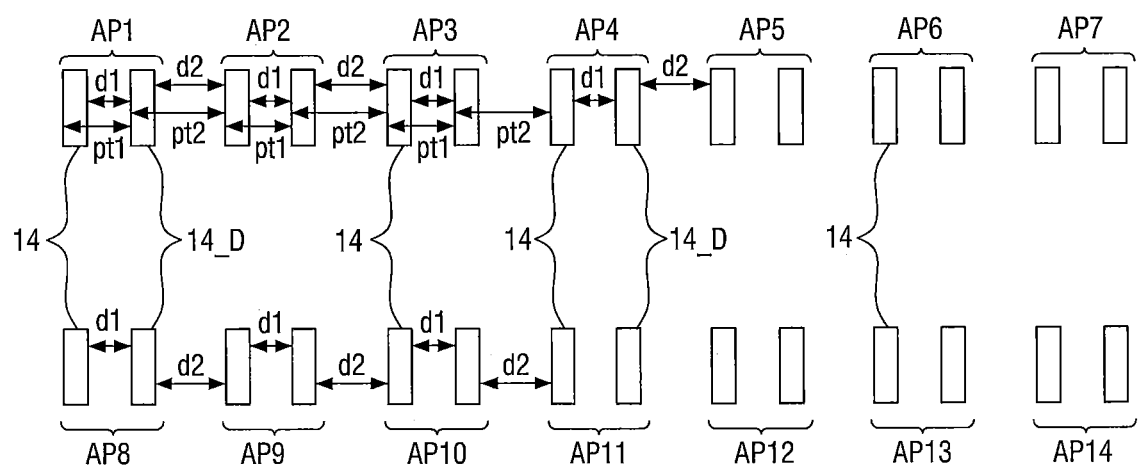

FIGS. 12A, 12B, and 12C show layouts of a portion of an integrated circuit device according to some embodiments. FIGS. 12A, 12B, and 12C show the layouts of the same portion of the integrated circuit device, and each of FIGS. 12A, 12B, and 12C shows a group of elements, rather than all elements, to simplify these drawings.

Referring to FIG. 12A, the portion may include a first pair of active regions AP1 through a fourteenth pair of active regions AP14. The first pair of active regions AP1 through a seventh pair of active regions AP7 may be spaced apart in the first horizontal direction X and may be arranged along the first horizontal direction X. A eighth pair of active regions AP8 through the fourteenth pair of active regions AP14 may be spaced apart in the first horizontal direction X and may be arranged along the first horizontal direction X. The first pair of active regions AP1 through the seventh pair of active regions AP7 and the eighth pair of active regions AP8 through fourteenth pair of active regions AP14 may be spaced apart in the second horizontal direction Y.

Each of the first pair of active regions AP1 through the fourteenth pair of active regions AP14 may include two active regions 14 that are spaced apart from each other in the first horizontal direction X by a first distance d1. The first pair of active regions AP1 through the fourteenth pair of active regions AP14 may include one or more dummy active region 14_D. The dummy active region 14_D may have a structure similar to the first and second dummy active regions 14_D1 and 14_D2 described with reference to FIGS. 2A through 3C. In some embodiments, the dummy active region 14_D may protrude from a substrate (e.g., the substrate 100 in FIG. 3B).

In some embodiments, two directly adjacent pairs among the first pair of active regions AP1 through the seventh pair of active regions AP7 (e.g., the second pair of active regions AP2 and the third pair of active regions AP3) in the first horizontal direction X may be spaced apart from each other by a second distance d2 in the first horizontal direction X. In some embodiments, two directly adjacent pairs among the eighth pair of active regions AP8 through the fourteenth pair of active regions AP14 (e.g., a tenth pair of active regions AP10 and an eleventh pair of active regions AP11) in the first horizontal direction X may be spaced apart from each other by the second distance d2 in the first horizontal direction X. In some embodiments, the first distance d1 may be different from the second distance d2. For example, the first distance d1 may be shorter than the second distance d2, as shown in FIG. 12A.

It will be understood that the term "directly adjacent" as used herein includes configurations where two elements (such as the second pair of active regions AP2 and the third pair of active regions AP3) which are said to be directly adjacent to one another are positioned so that no other like element is located between the two elements.

Two active regions in a single pair among the first pair of active regions AP1 through the fourteenth pair of active regions AP14 may be spaced apart from each other in a first pitch pt1 in the first horizontal direction X, and two directly adjacent pairs among the first pair of active regions AP1 through the seventh pair of active regions AP7 and the eighth pair of active regions AP8 through the fourteenth pair of active regions AP14 are spaced apart from each other in a second pitch pt2 in the first horizontal direction X, as shown in FIG. 12A.

In some embodiments, metal lines (e.g., the first and second conductive lines 44_1 and 44_2 in FIG. 2B) provided on the first pair of active regions AP1 through the fourteenth pair of active regions AP14 may be provided to have a third pitch that is between the first pitch pt1 and the second pitch pt2. In some embodiments, the third pitch is an average of the first pitch pt1 and the second pitch pt2.

Referring to FIG. 12B, the portion of the integrated circuit device may include multiple source/drain regions including a first bottom source/drain region 12_1 through a tenth bottom source/drain region 12_10. The first bottom source/drain region 12_1 through a fourth bottom source/drain region 12_4 may be spaced apart in the first horizontal direction X and may be arranged along the first horizontal direction X. A fifth bottom source/drain region 12_5 through the tenth bottom source/drain region 12_10 may be spaced apart in the first horizontal direction X and may be arranged along the first horizontal direction X. The first bottom source/drain region 12_1 through the fourth bottom source/drain region 12_4 and the fifth bottom source/drain region 12_5 through the tenth bottom source/drain region 12_10 may be spaced apart in the second horizontal direction Y.

In some embodiments, two directly adjacent ones among the first bottom source/drain region 12_1 through the fourth bottom source/drain region 12_4 (e.g., a second source/drain region 12_2 and a third source/drain region 12_3) in the first horizontal direction X may be spaced apart from each other by a third distance d3 in the first horizontal direction X. In some embodiments, two directly adjacent ones among the fifth bottom source/drain region 12_5 through the tenth bottom source/drain region 12_10 (e.g., a sixth source/drain region 12_6 and a seventh source/drain region 12_7) in the first horizontal direction X may be spaced apart from each other by the third distance d3 in the first horizontal direction X. In some embodiments, the third distance d3 may be shorter than the second distance d2.

A space between two directly adjacent bottom source/drain regions in the first horizontal direction X may be referred to as "a bottom source/drain region break" as no bottom source/drain region is provided therein. In some embodiments, each of bottom source/drain region breaks may be provided between two directly adjacent pairs of active regions in a plan view, and the bottom source/drain region breaks may not be provided between active regions of a single pair of active regions in the plan view, as illustrated in FIG. 12B.

In some embodiments, some of the first bottom source/drain region 12_1 through the tenth bottom source/drain region 12_10 (e.g., the sixth bottom source/drain region 12_6) may have a first width w1 in the first horizontal direction X, and others of the first bottom source/drain region 12_1 through the tenth bottom source/drain region 12_10 (e.g., the ninth bottom source/drain region 12_9) may have a second width w2 in the first horizontal direction X. The second width w2 may be wider than the first width w1. In some embodiments, the first width w1 may be greater than the first distance d1.

Still referring to FIG. 12B, each pair of the first pair of active regions AP1 through the fourteenth pair of active regions AP14 may be in a respective one of the first bottom source/drain region 12_1 through the tenth bottom source/drain region 12_10 in a plan view. The second pair of active regions AP2 and the third pair of active regions AP3 may be in a single bottom source/drain region (i.e., the second bottom source/drain region 12_2) in the plan view, and thus the second bottom source/drain region 12_2 may be referred to as a common bottom source/drain region of the second pair of active regions AP2 and the third pair of active regions AP3. In some embodiments, each of the first bottom source/drain region 12_1 through the tenth bottom source/drain region 12_10 may be overlapped by an even number (e.g., 2, 4, or 6) of active regions as shown in FIG. 12B.

Referring to FIG. 12C, the portion of the integrated circuit device may also include multiple common gate layers (e.g., a first common gate layer 18_1 through an eighth common gate layer 18_8). Each of the common gate layers may extend longitudinally in the second horizontal direction Y. The first common gate layer 18_1 through the eighth common gate layer 18_8 may be spaced apart in the first horizontal direction X.

In some embodiments, the portion of the integrated circuit device may include multiple standard cells (e.g., a first standard cell STC1 through a fourth standard cell STC4) that may be spaced apart in the first horizontal direction X and may be arranged along the first horizontal direction X.

The first standard cell STC1 may include the first pair of active regions AP1, the first bottom source/drain region 12_1 and the fifth bottom source/drain region 12_5, and the first common gate layer 18_1. The first standard cell STC1 may include a first field effect transistor (e.g., a VFET) including a first active region of the first pair of active regions AP1, the first bottom source/drain region 12_1, and the first common gate layer 18_1, and a second field effect transistor (e.g., a VFET) including a first active region of the eighth pair of active regions AP8, the fifth bottom source/drain region 12_5, and the first common gate layer 18_1. The first standard cell STC1 may also include two dummy active regions 14_D, as illustrated in FIG. 12C. In some embodiments, the first common gate layer 18_1 may be spaced apart from the dummy active regions 14_D, and the first common gate layer 18_1 may not be operatively connected to the dummy active regions 14_D. For example, the first standard cell STC1 may be an inverter.

In some embodiments, the second standard cell STC2 may be a 2-input NAND gate, and a third standard cell STC3 may be an inverter.

Figure 14A:
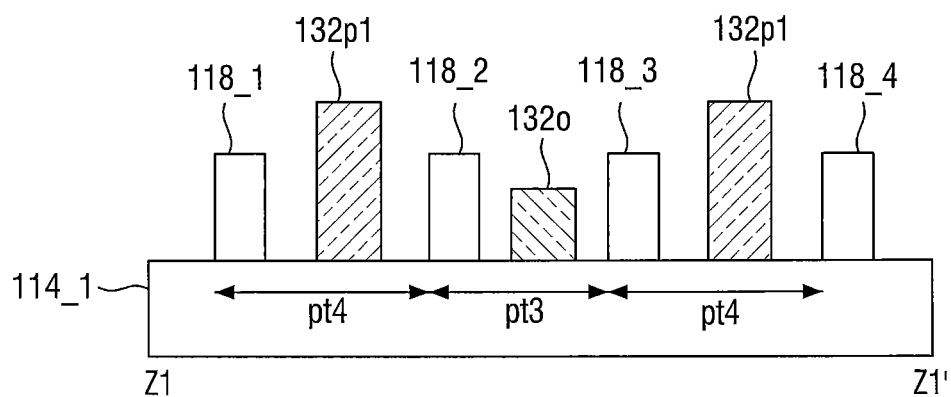
FIGS. 14A and 14B are cross-sectional views taken along the lines Z1-Z1' and Z2-Z2' of FIG. 13, respectively.
Figure 14B:
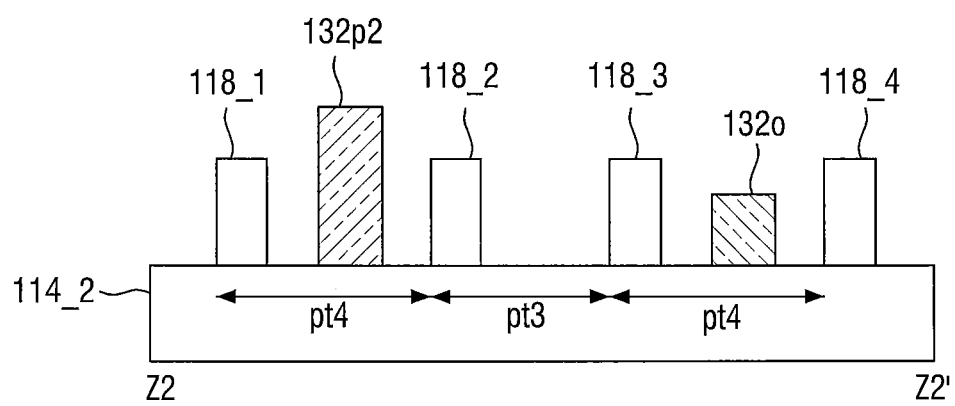
Figure 15:
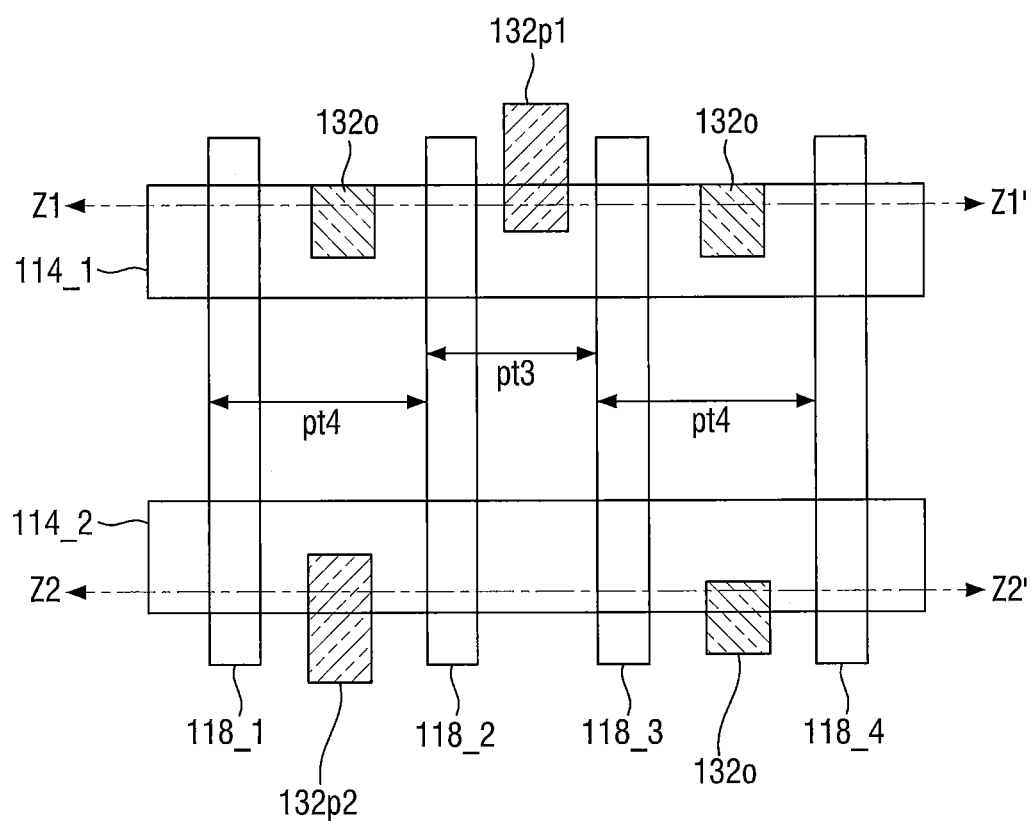
Figure 16A:
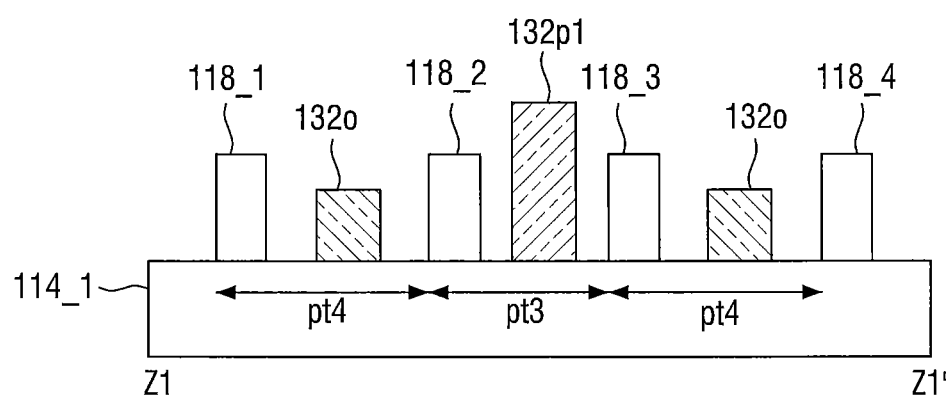
FIGS. 16A and 16B are cross-sectional views taken along the lines Z1-Z1' and Z2-Z2' of FIG. 15, respectively.
Figure 16B:
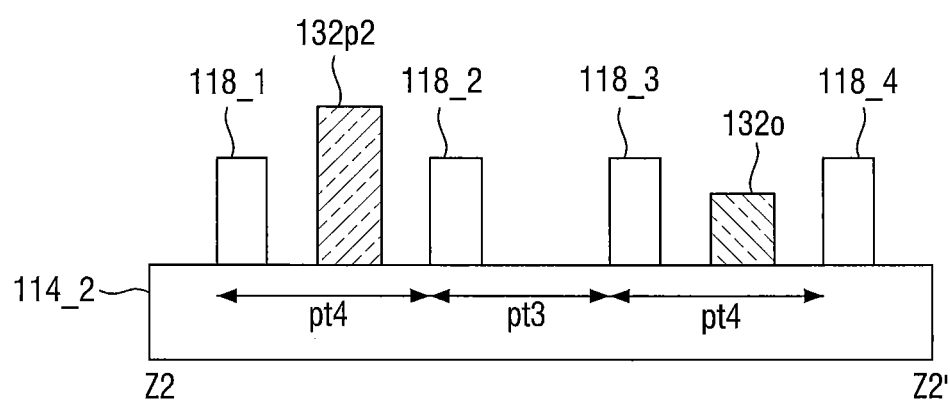

FIGS. 13 and 15 are layouts of the 2-input NAND gate of FIG. 8 according to some embodiments. FIGS. 14A and 14B are cross-sectional views taken along the lines Z1-Z1' and Z2-Z2' of FIG. 13, respectively, and FIGS. 16A and 16B are cross-sectional views taken along the lines Z1-Z1' and Z2-Z2' of FIG. 15, respectively. It will be understood that not all elements of the 2-input NAND gate are shown in FIGS. 13 through 16B to simplify drawings.

Referring to FIGS. 13 through 15, the 2-input NAND gate may include non-VFETs (e.g., a planar transistor and a Fin field-effect transistor (FinFET)) in which current flows along a surface of a substrate. The 2-input NAND gate may include a first active region 114_1 and a second active region 114_2 that may be spaced apart from each other in the second horizontal direction Y. Each of the first and second active regions 114_1 and 114_2 may extend longitudinally in the first horizontal direction X. The first active region 114_1 may be an active region of the first P-type VFET P1 and the second P-type VFET P2, and the second active region 114_2 may be an active region of the first N-type VFET N1 and the second N-type VFET N2. In some embodiments, each of the first P-type VFET P1, the second P-type VFET P2, the first N-type VFET N1, and the second N-type VFET N2 may be a FinFET or a planar transistor.

The 2-input NAND gate may also include a first common gate layer 118_1 through a fourth common gate layer 118_4. Each of the first common gate layer 118_1 through the fourth common gate layer 118_4 may extend longitudinally in the second horizontal direction Y. The first common gate layer 118_1 through the fourth common gate layer 118_4 may be spaced apart in the first horizontal direction X and arranged along the first horizontal direction X.

In some embodiments, the first common gate layer 118_1 through the fourth common gate layer 118_4 may be arranged to have variable pitches. For example, a second common gate layer 118_2 and a third common gate layer 118_3 may have a third pitch pt3. The first common gate layer 118_1 and the second common gate layer 118_2 may have a fourth pitch pt4, and the third common gate layer 118_3 and the fourth common gate layer 118_4 may have the fourth pitch pt4. The third pitch pt3 may be shorter than the fourth pitch pt4.

In some embodiments, a first power contact 132p1, a second power contact 132p2, and output contacts 132o may be provided between two adjacent common gate layers. For example, a drain voltage $V_{DD}$ may be applied to the first power contact 132p1, and a source voltage $V_{SS}$ may be applied to the second power contact 132p2. The 2-input NAND gate may output its output through output contacts 132o.

Referring to FIGS. 14A, 14B, 16A, and 16B, in some embodiments, each of the first power contact 132p1, the second power contact 132p2, and the output contacts 132o may be provided on one of the first and second active regions 114_1 and 114_2 and between two adjacent common gate layers.

Figure 17:
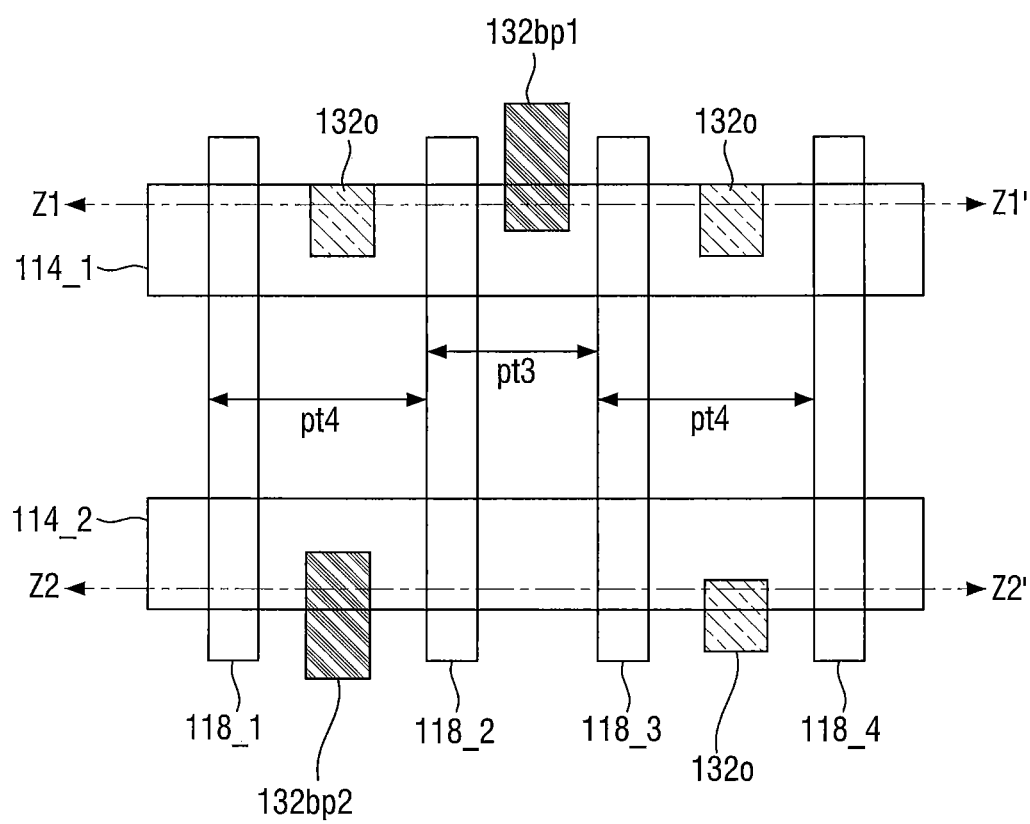
FIG. 17 is a layout of the 2-input NAND gate of FIG. 8 according to some embodiments.
Figure 18A:
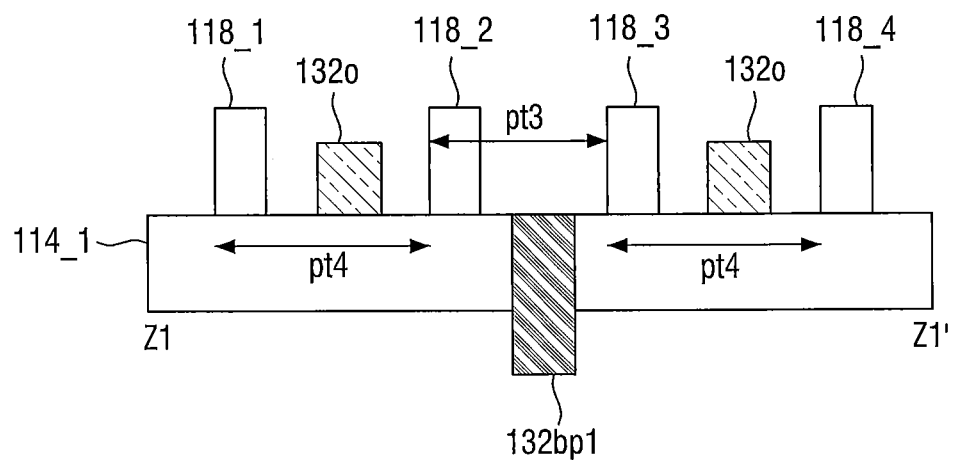
FIGS. 18A and 18B are cross-sectional views taken along the lines Z1-Z1' and Z2-Z2' of FIG. 17, respectively.
Figure 18B:
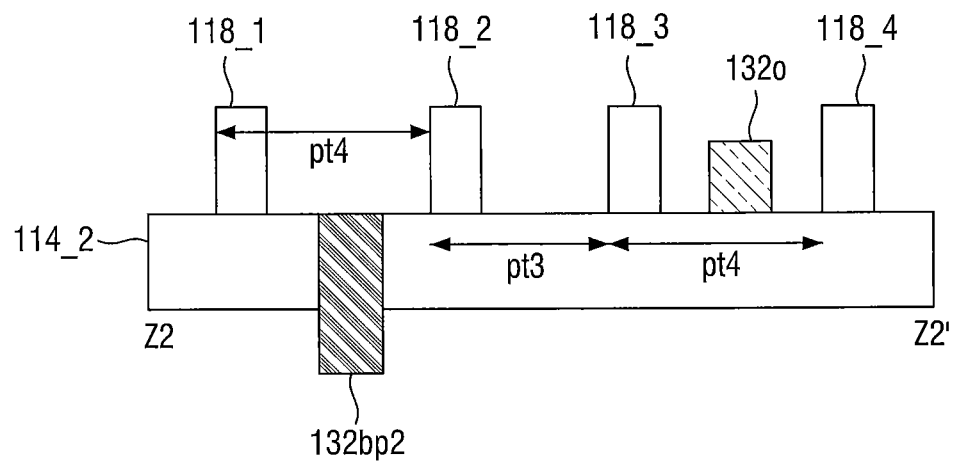

FIG. 17 is a layout of the 2-input NAND gate of FIG. 8 according to some embodiments, and FIGS. 18A and 18B are cross-sectional views taken along the lines Z1-Z1' and Z2-Z2' of FIG. 17, respectively.

The 2-input NAND gate shown in FIGS. 17, 18A, and 18B is similar to those described with reference to FIGS. 13 through 16B except for a first buried power rail 132*bp*1 and a second buried power rail 132*bp*2. Referring to FIGS. 18A and 18B, the 2-input NAND gate may include the first buried power rail 132*bp*1 and the second buried power rail 132*bp*2 that are provided in the first active region 114_1 and the second active region 114_2, respectively. Because the first buried power rail 132*bp*1 and the second buried power rail 132*bp*2 are not provided between sides of two adjacent common gate layers on the first active region 114_1 and the second active region 114_2, the likelihood of an electrical short occurring between the two adjacent common gate layers and one of first buried power rail 132*bp*1 and the second buried power rail 132*bp*2 may decrease.

FIGS. 19A through 19D show various active regions having non-linear shapes in a plan view. Specifically, each of FIGS. 19A through 19D shows four active regions adjacent to each other (e.g., the first pair of active regions AP1 and the eighth pair of active regions AP8 in FIG. 12A).

Figure 19A:
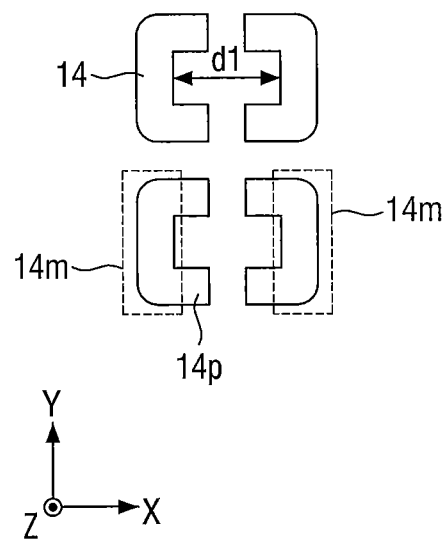
FIGS. 19A through 19D show various active regions having non-linear shapes in a plan view.

Referring to FIG. 19A, each of the active regions 14 may include a main portion 14*m* that has a linear shape (e.g., a line shape) extending longitudinally in the second horizontal direction Y and a protruding portion 14*p* protruding from the main portion 14*m* in the first horizontal direction X. In some embodiments, each of the active regions 14 may include two protruding portions 14*p* protruding from respective end portions of the main portion 14*m*, as shown in FIG. 19A.

Figure 19B:
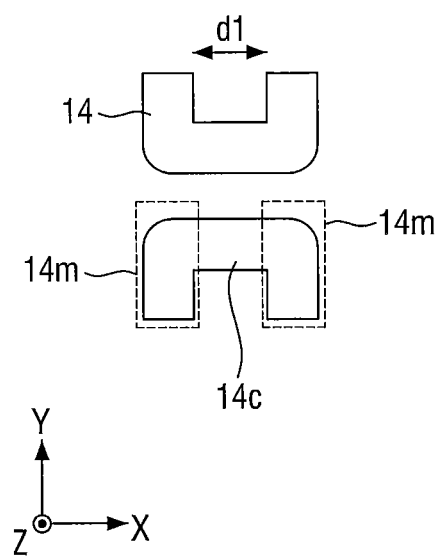
Figure 19C:
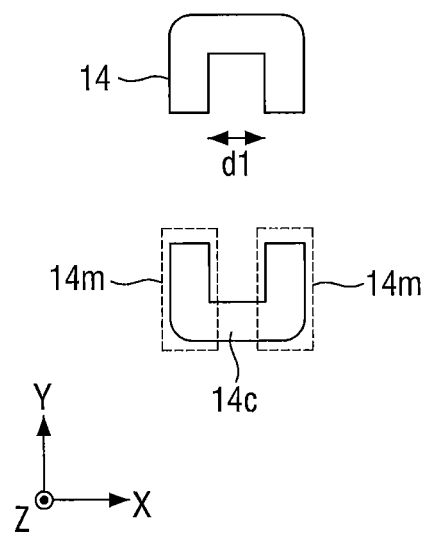
Figure 19D:
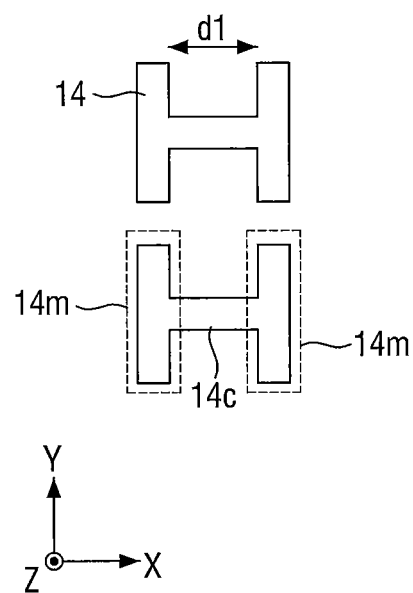

Referring to FIGS. 19B through 19D, two active regions directly adjacent to each other in the first horizontal direction X (e.g., two active regions of the first pair of the active regions AP1) may be connected each other and may form a single active region. Each of the two active regions directly adjacent to each other in the first horizontal direction X may include a main portion 14*m* that has a linear shape (e.g., a line shape) extending longitudinally in the second horizontal direction Y and a portion protruding from the main portion 14*m*. The portions protruding from the main portions 14*m* may be connected to each other to form a connecting portion 14*c*. It will be understood that the protruding portion 14*p* and the connecting portion 14*c* may increase a channel width and thus may contribute to increased channel current.

In some embodiments, the main portions 14*m* of two active regions directly adjacent to each other in the first horizontal direction X may be spaced apart from each other by the first distance d1 in the first horizontal direction X as described with reference to FIG. 12A.

It will be understood that the active regions shown in FIGS. 19A through 19D may be used in various standard cells, including inverters and 2-input NAND gates described with reference to FIG. 1 through FIG. 12C.

Figure 20:
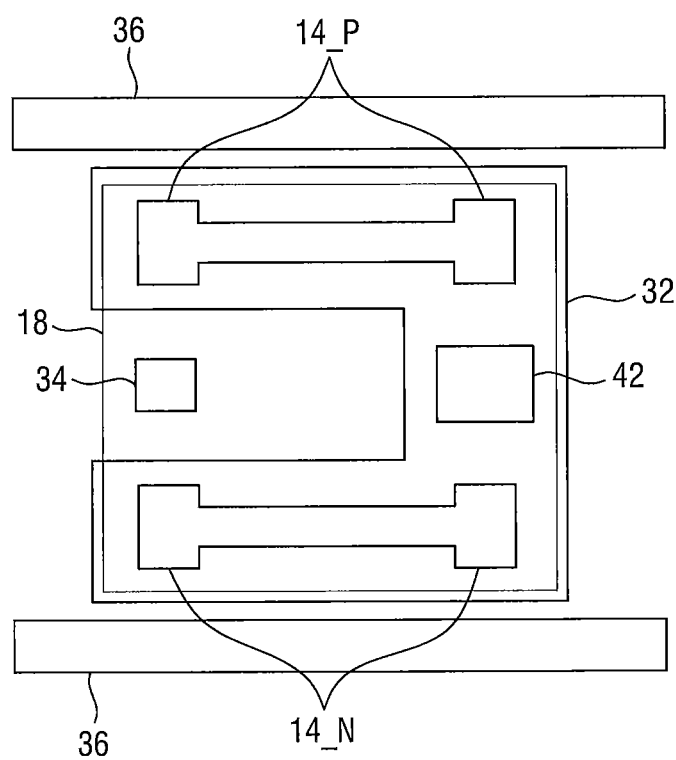
FIG. 20 is a layout of the inverter of FIG. 5 according to some embodiments.

FIG. 20 is a layout of the inverter of FIG. 5 according to some embodiments. For simplicity of illustration, FIG. 20 does not show all elements of the inverter of FIG. 5. The inverter shown in FIG. 20 is similar to the inverter shown in FIG. 6A except for shapes of channel regions. Referring to FIG. 20, the two first channel regions 14_P of FIG. 6A may be connected to be a single first channel region 14_P, and the two second channel regions 14_N of FIG. 6A may be connected to be a single second channel region 14_N.

Figure 21:
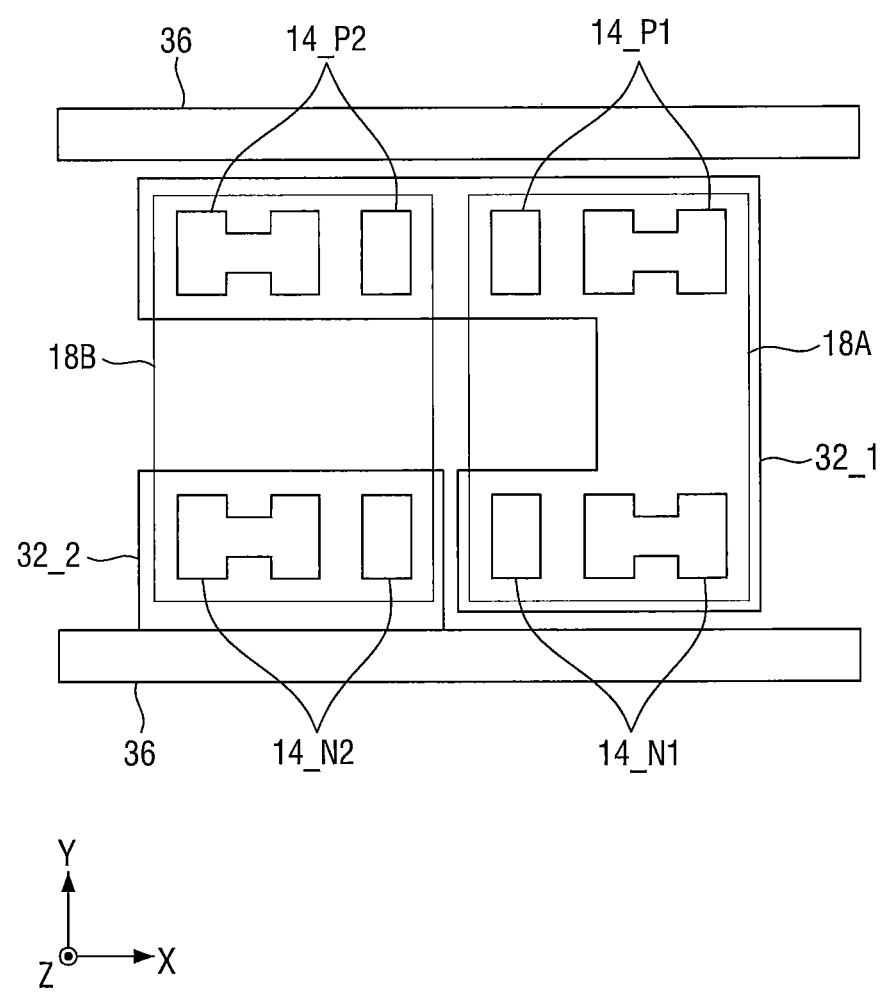
FIGS. 21 and 22 are layouts of the 2-input NAND gate of FIG. 8, according to some embodiments.
Figure 22:
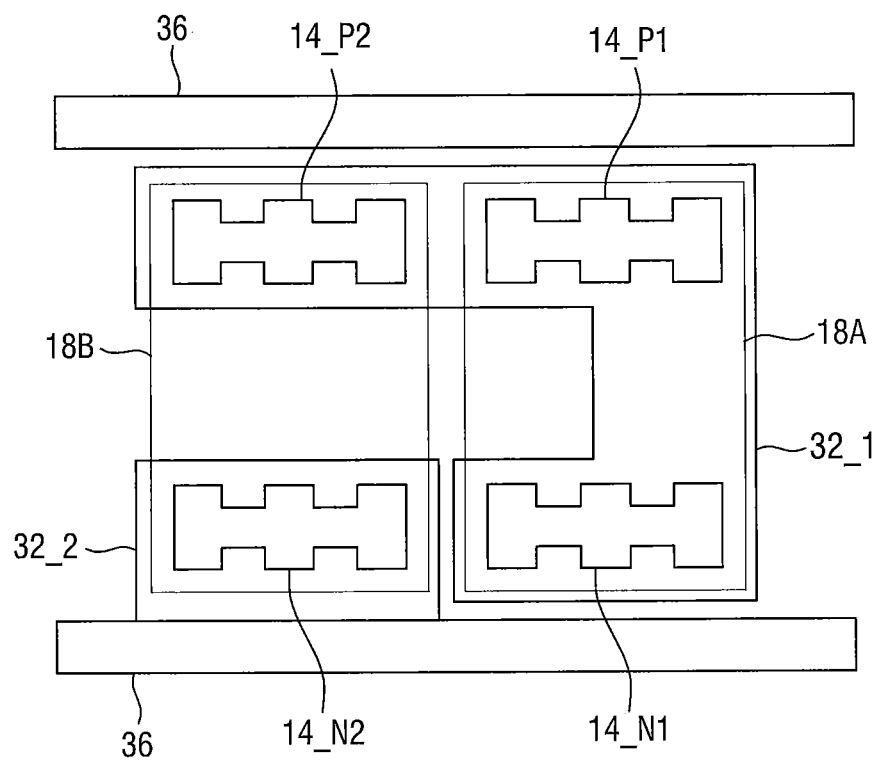

FIGS. 21 and 22 are layouts of the 2-input NAND gate of FIG. 8, according to some embodiments. The 2-input NAND gate shown in FIGS. 21 and 22 is similar to the 2-input NAND gate shown in FIG. 11 except for shapes of channel regions.

Referring to FIG. 21, two of the first channel regions 14_P1 in FIG. 11 may be connected to be a single first channel region 14_P1, and two of the third channel regions 14_P2 in FIG. 11 may be connected to be a single third channel region 14_P2. Two of the second channel regions 14_N1 in FIG. 11 may be connected to be a single second channel region 14_N1, and two of the fourth channel regions 14_N2 in FIG. 11 may be connected to be a single fourth channel region 14_N2.

Referring to FIG. 22, the three first channel regions 14_P1 in FIG. 11 may be connected to be a single first channel region 14_P1, the three third channel regions 14_P2 in FIG. 11 may be connected to be a single third channel region 14_P2, the three second channel regions 14_N1 in FIG. 11 may be connected to be a single second channel region 14_N1, and the three fourth channel regions 14_N2 in FIG. 11 may be connected to be a single fourth channel region 14_N2.

FIGS. 23 through 28 show a method of forming multiple standard cells including active regions having different shapes according to some embodiments. Specifically, some of the standard cells may include active regions having a linear shape, and some of the standard cells may include active regions having non-linear shapes. FIGS. 23 through 28 show intermediate structures in a plan view.

Figure 23:
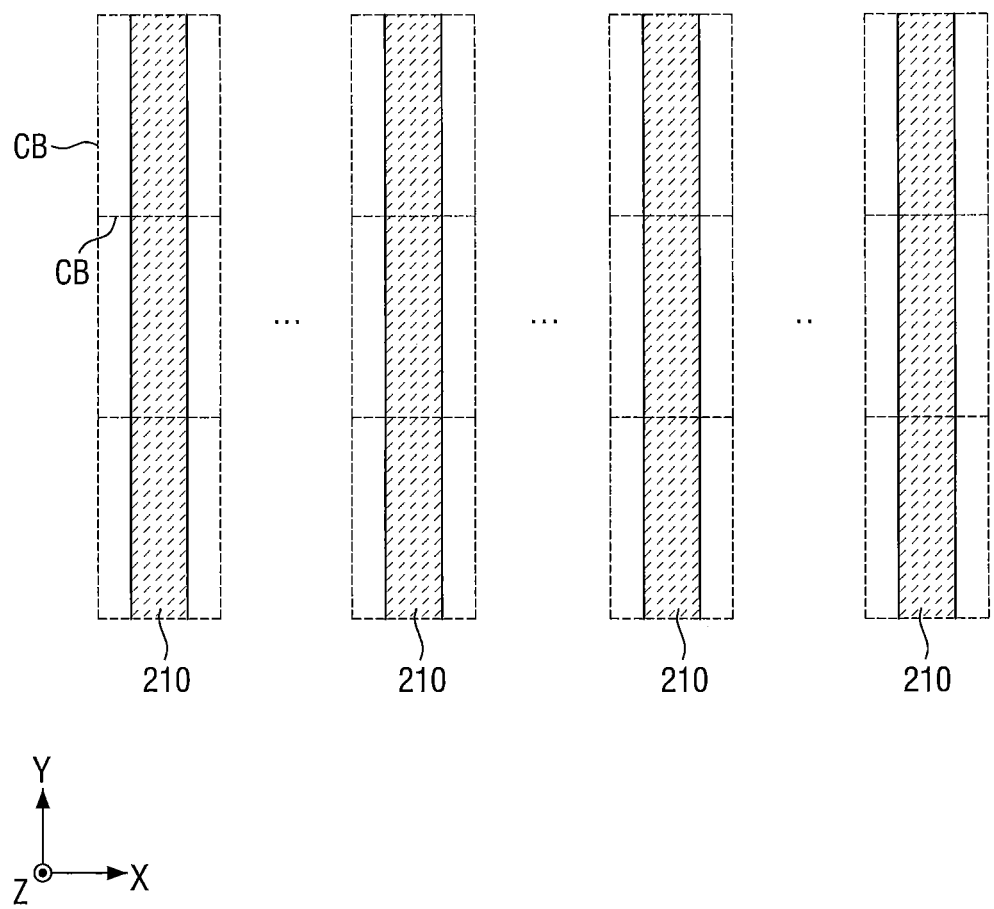
FIGS. 23 through 28 show a method of forming multiple standard cells including active regions having different shapes according to some embodiments.

Referring to FIG. 23, supporting layers 210 may be formed on multiple standard cells that are arranged along the first horizontal direction X and the second horizontal direction Y. The standard cells may be separated from each other by cell boundaries CB. Each of the supporting layers 210 may extend longitudinally in the second horizontal direction Y and may extend across multiple standard cells (e.g., three standard cells) spaced apart in the second horizontal direction Y.

Figure 24:
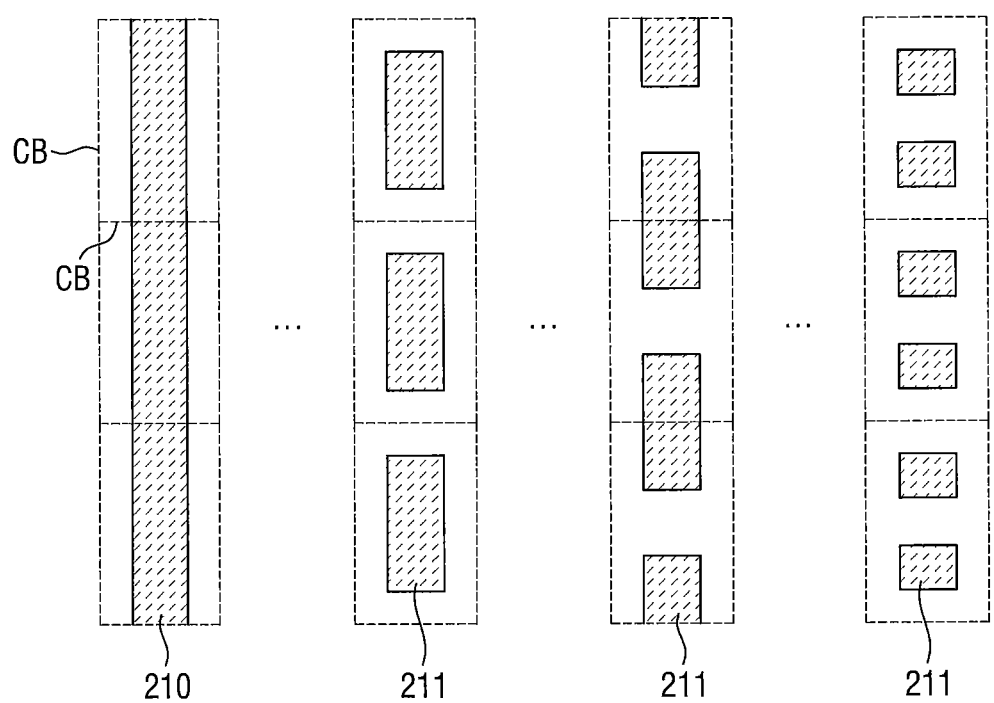

Referring to FIG. 24, patterned supporting layers 211 may be formed by removing portions of the supporting layers 210. The patterned supporting layers 211 may have various lengths in the second horizontal direction Y as shown in FIG. 24. In some embodiments, some of patterned supporting layers 211 that are spaced apart in the second horizontal direction Y may have the same width in the first horizontal direction X.

Figure 25:
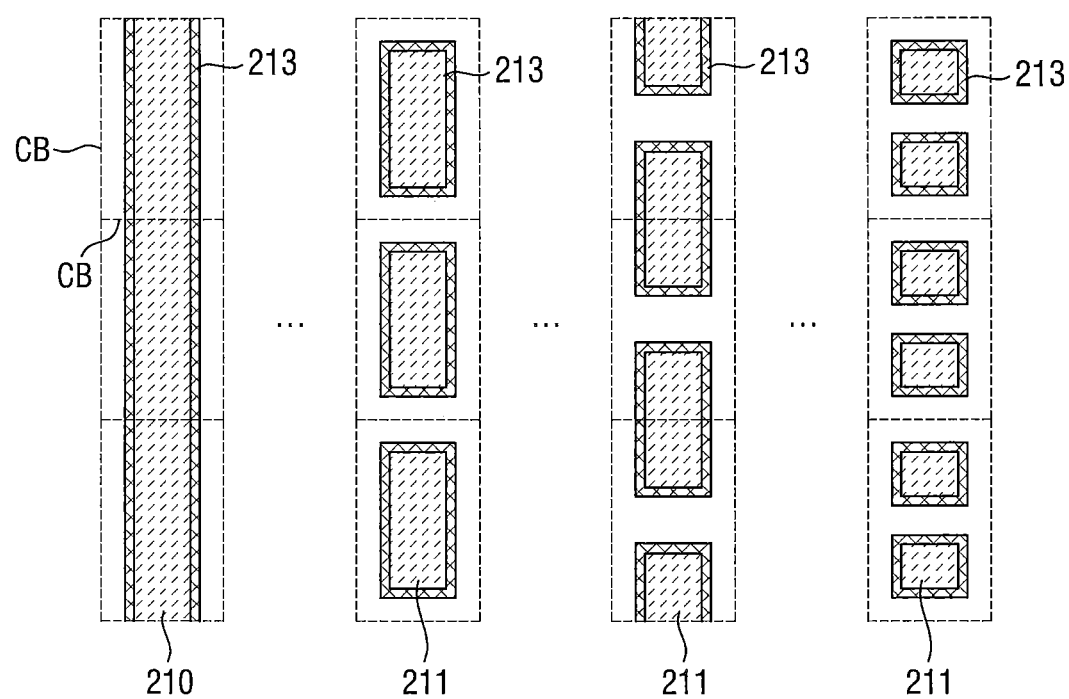

Referring to FIG. 25, channel layers 213 may be formed on sides of the supporting layer 210 and on sides of the patterned supporting layers 211, respectively. In some embodiments, each of the channel layers 213 may have an uniform thickness along one of the sides of the supporting layer 210 and a respective one of the sides of the patterned supporting layers 211.

Figure 26:
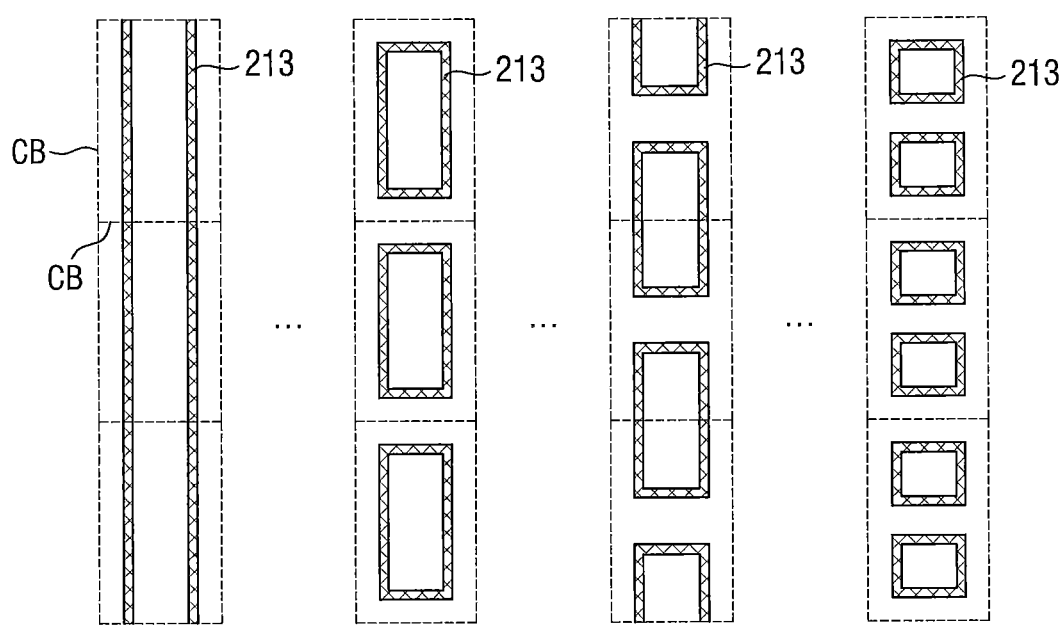

Referring to FIG. 26, the supporting layer 210 and the patterned supporting layers 211 may be removed. The supporting layer 210 and the patterned supporting layers 211 may include a material different from a material of the channel layers 213 such that the supporting layer 210 and the patterned supporting layers 211 can be selectively removed.

Figure 27:
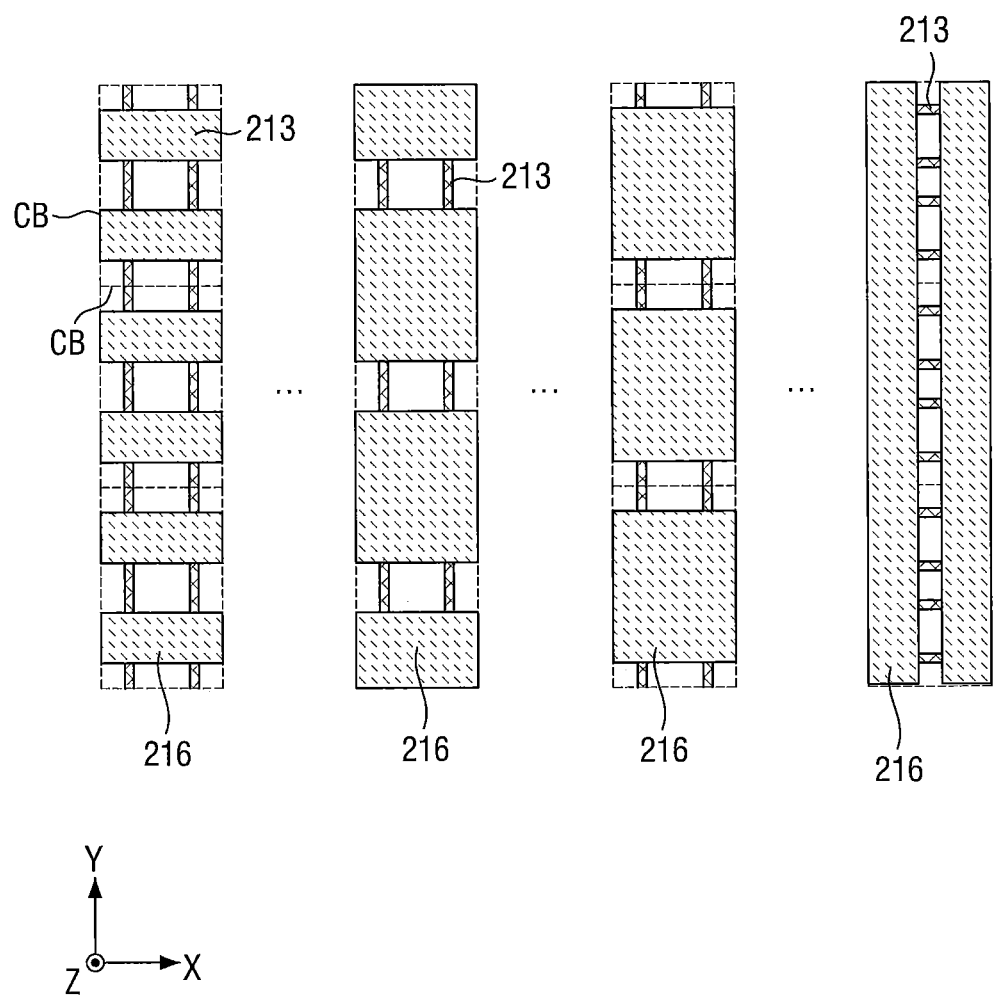

Referring to FIG. 27, mask layers 216 may be formed on first portions of the channel layers 213 to protect the first portions from removal by a subsequent process. Second portions of the channel layers 213 exposed by the mask layers 216 may be removed by, for example, an etching process (e.g., a wet etching process and/or a dry etching process).

Figure 28:
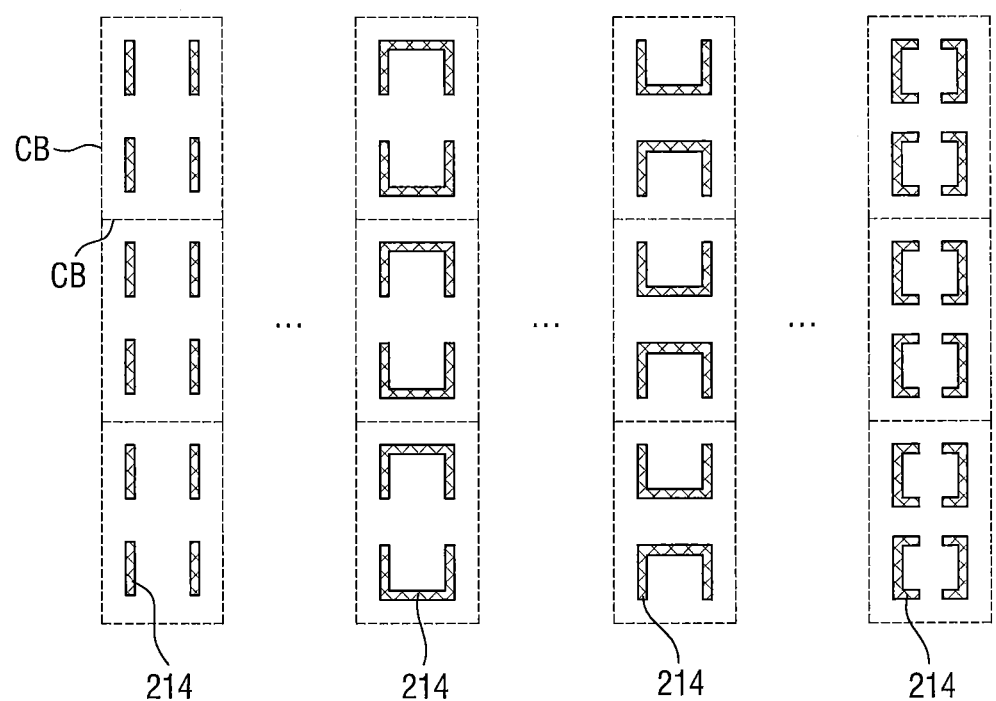

Referring to FIG. 28, the mask layers 216 may be removed after removing the second portions of the channel layers 213 exposed by the mask layers 216, and active regions 214 having various shapes may be formed.

According to the method described with reference to FIGS. 23 through 28, active regions having a linear shape and active regions having various non-linear shapes may be formed concurrently.

FIGS. 29 through 32 show a method of forming multiple standard cells including active regions having different shapes according to some embodiments. According to the method, two standard cells that are adjacent to each other in the second horizontal direction Y and have different shapes may be formed concurrently.

Figure 29:
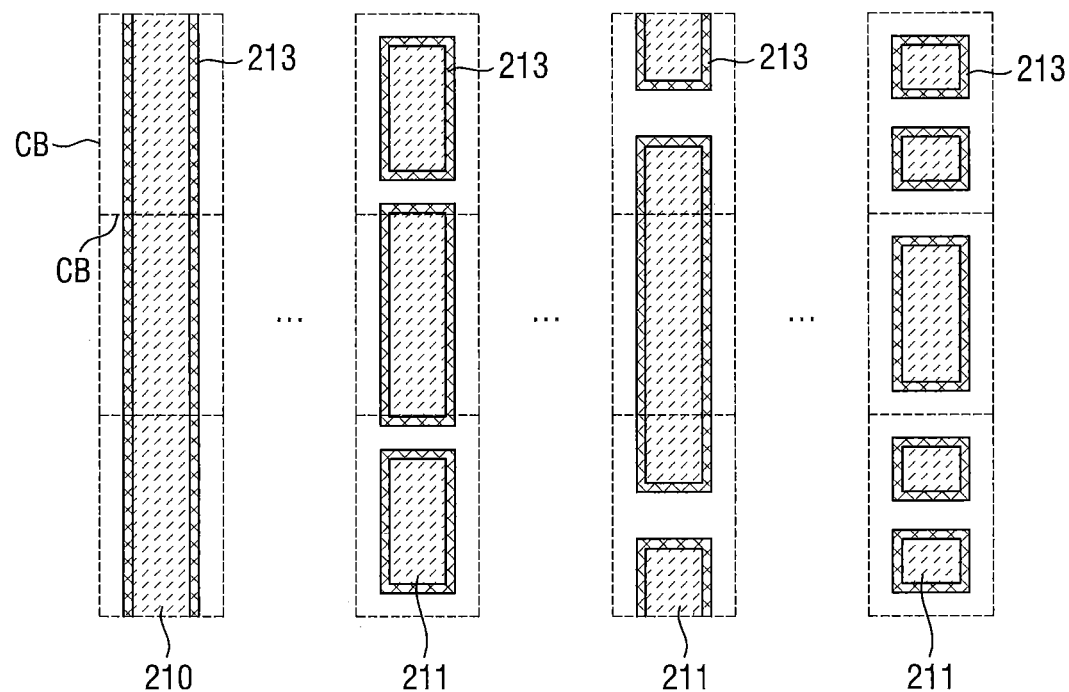
FIGS. 29 through 32 show a method of forming multiple standard cells including active regions having different shapes according to some embodiments.

Referring to FIG. 29, a supporting layer 210 and patterned supporting layers 211 may be formed, and then channel layers 213 may be formed on sides of the supporting layer 210 and the patterned supporting layers 211.

Figure 30:
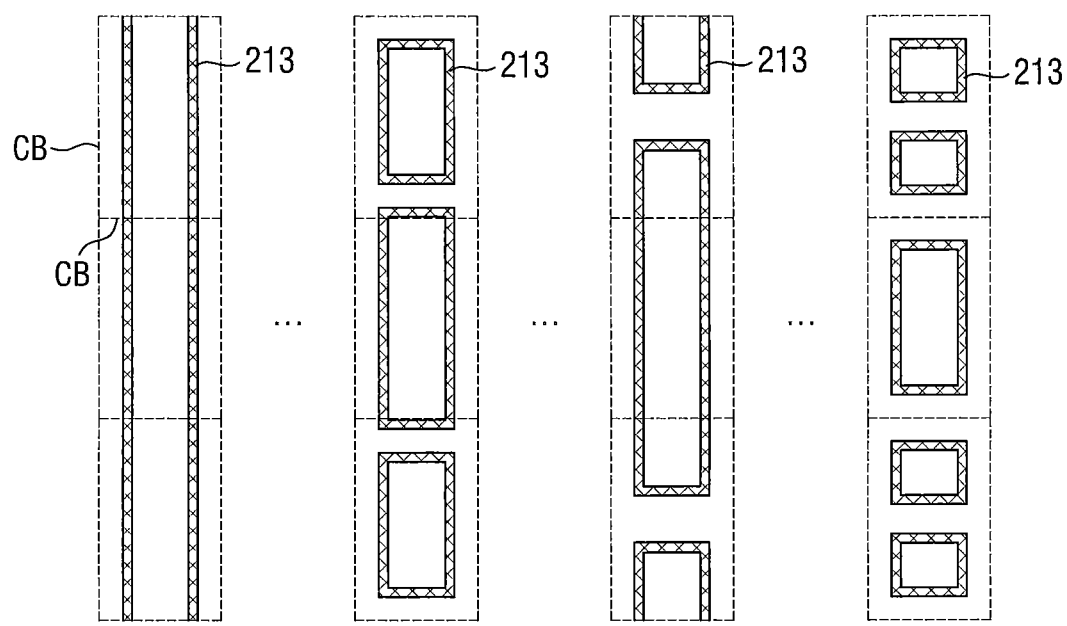

Referring to FIG. 30, the supporting layer 210 and the patterned supporting layers 211 may be selectively removed.

Figure 31:
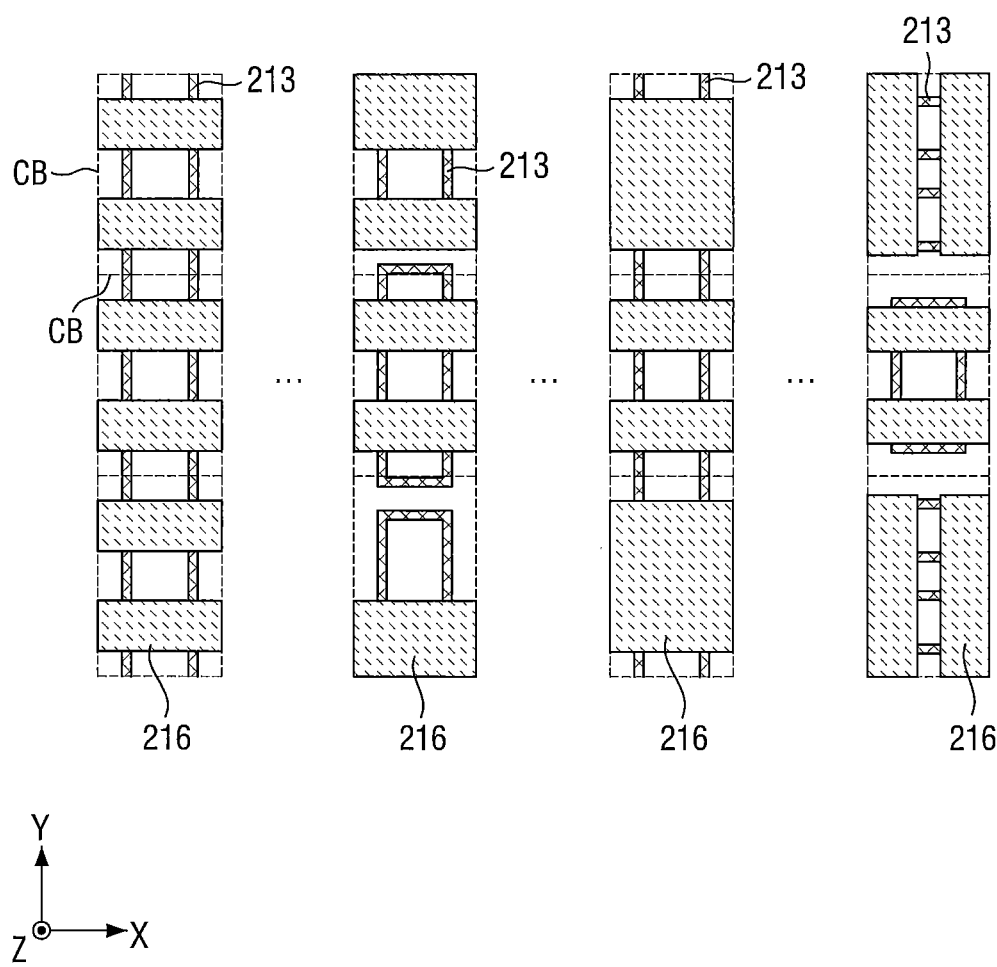

Referring to FIG. 31, mask layers 216 may be formed on first portions of the channel layers 213 to protect the first portions from removal by a subsequent process. Second portions of the channel layers 213 exposed by the mask layers 216 may be removed by, for example, an etching process.

Figure 32:
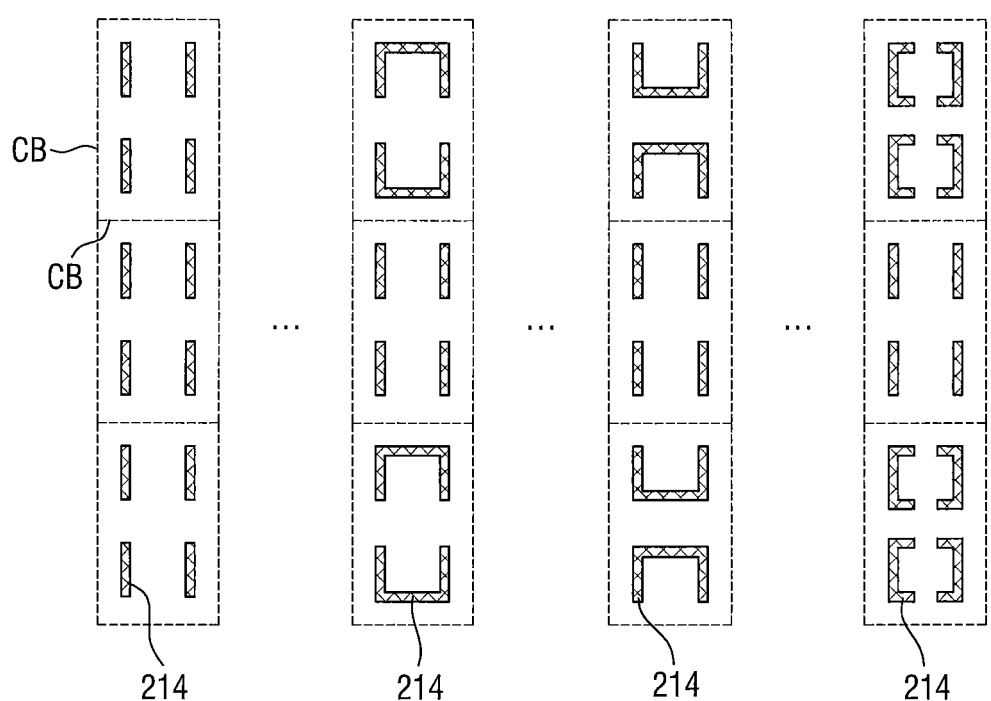

Referring to FIG. 32, the mask layers 216 may be removed after removing the second portions of the channel layers 213 exposed by the mask layers 216, and active regions 214 having various shapes may be formed. Two standard cells directly adjacent to each other in the second horizontal direction Y may include active regions 214 having different shapes.

Figure 33:
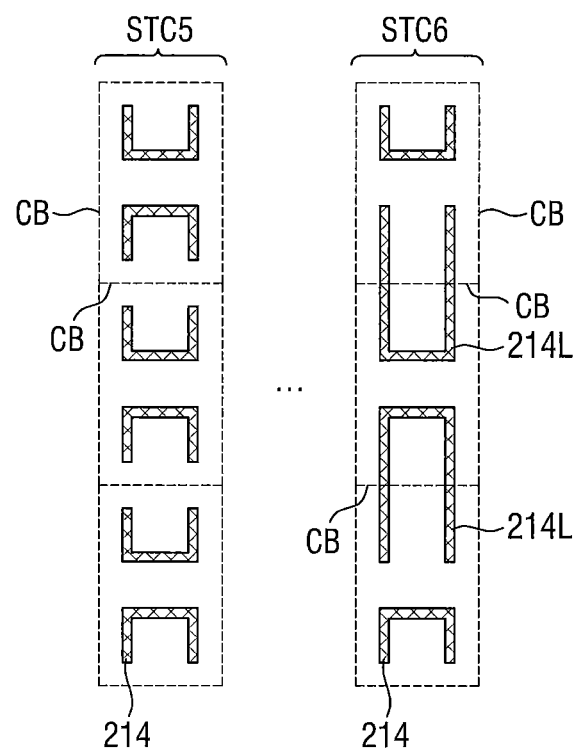
FIG. 33 shows an integrated circuit device including standard cells having a double height structure.

FIG. 33 shows an integrated circuit device including standard cells having a double height structure. The integrated circuit device may include a fifth standard cell STC5 and a sixth standard cell STC6, and each of the fifth standard cell STC5 and the sixth standard cell STC6 may have a double height structure. Each of the fifth standard cell STC5 and the sixth standard cell STC6 may include three unit cells separated by cell boundaries CB.

In some embodiments, each of the unit cells in the fifth standard cell STC5 may include two active regions 214 having non-linear shapes. In some embodiments, the sixth standard cell STC6 may include long active regions 214L. Each of the long active regions 214L may have a portion that may extend longitudinally in the second horizontal direction Y and may traverse the cell boundary CB. It will be understood that the long active regions 214L may provide a wide channel and thus may contribute to increased channel current.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
    a plurality of active regions spaced apart from each other in a first direction, each of the plurality of active regions protruding from an upper surface of a substrate; and
    a first bottom source/drain region in the substrate,
    wherein the plurality of active regions comprise a first pair of active regions, a second pair of active regions, and a third pair of active regions, and the first pair of active regions, the second pair of active regions, and the third pair of active regions are spaced apart from each other in the first direction and are sequentially arranged along the first direction,
    wherein the first pair of active regions are spaced apart from each other by a first distance in the first direction, the second pair of active regions are spaced apart from each other by the first distance in the first direction, and the third pair of active regions are spaced apart from each other by the first distance in the first direction,
    wherein the first pair of active regions is spaced apart from the second pair of active regions by a second distance in the first direction, and the second pair of active regions is spaced apart from the third pair of active regions by the second distance in the first direction,
    wherein the first distance is shorter than the second distance, and wherein the integrated circuit device comprises a first vertical field effect transistor (VFET) that comprises a first active region of the first pair of active regions and the first bottom source/drain region, and a second active region of the first pair of active regions is a dummy active region.

2. The integrated circuit device of claim 1, wherein the first bottom source/drain region has a first width in the first direction, and the first width is greater than the first distance.

3. The integrated circuit device of claim 2, wherein the integrated circuit device further comprises a second VFET that comprises the second pair of active regions and a second bottom source/drain region, and
wherein the first bottom source/drain region and the second bottom source/drain region are spaced part from each other by a third distance in the first direction, and the third distance is shorter than the second distance.

4. The integrated circuit device of claim 1, wherein, in a plan view, the first pair of active regions are in the first bottom source/drain region.

5. The integrated circuit device of claim 4, wherein the first VFET further comprises a first gate structure operatively connected to the first active region of the first pair of active regions, and the first gate structure is not operatively connected to the second active region of the first pair of active regions.

6. The integrated circuit device of claim 1, wherein the integrated circuit device further comprises:
a second VFET comprising the second pair of active regions and a second bottom source/drain region; and
a third VFET comprising the third pair of active regions and a third bottom source/drain region, wherein the second bottom source/drain region is spaced from the first bottom source/drain region and the third bottom source/drain region by a third distance in the first direction.

7. The integrated circuit device of claim 6, wherein each of the first bottom source/drain region, the second bottom source/drain region, and the third bottom source/drain region has a first width in the first direction.

8. The integrated circuit device of claim 1, wherein the integrated circuit device further comprises:
a second VFET comprising the second pair of active regions and a second bottom source/drain region; and
a third VFET comprising the third pair of active regions and a third bottom source/drain region,
wherein the second bottom source/drain region and the third bottom source/drain region are a first portion and a second portion of a common bottom source/drain region, respectively, and
wherein the first bottom source/drain region and the common bottom source/drain region are spaced part from each other in the first direction by a third distance that is shorter than the second distance.

9. An integrated circuit device comprising:
a bottom source/drain region on a substrate;
a first active region and a second active region spaced apart from each other in a first direction, wherein each of the first active region and the second active region protrudes from an upper surface of the substrate, the first active region and the second active region are in the bottom source/drain region in a plan view, and the second active region is a dummy active region; and
a gate structure on a side of the first active region.

10. The integrated circuit device of claim 9, wherein the gate structure is spaced apart from the second active region.

11. The integrated circuit device of claim 9 further comprising an insulating layer on the substrate,
wherein the gate structure is in the insulating layer, and
wherein the insulating layer contacts the second active region.

12. The integrated circuit device of claim 9, further comprising:
a third active region and a fourth active region spaced apart from each other in the first direction,
wherein the third active region is directly adjacent to the second active region in the first direction,
wherein the first active region and the second active region are spaced apart from each other by a first distance in the first direction, and the third active region and the fourth active region are spaced apart from each other by the first distance in the first direction, and
wherein the second active region and the third active region are spaced apart from each other by a second distance in the first direction, and the second distance is longer than the first distance.

13. The integrated circuit device of claim 12, wherein the integrated circuit device comprises:
a first standard cell comprising the first and second active regions; and
a second standard cell comprising the third and fourth active regions.

14. The integrated circuit device of claim 9, wherein the bottom source/drain region is a first one of a plurality of bottom source/drain regions, and two directly adjacent ones of the plurality of bottom source/drain regions are spaced apart from each other by a third distance in the first direction,
wherein the first active region is a first one of a plurality of active regions, the second active region is a second one of the plurality of active regions, and the plurality of active regions are spaced apart from each in the first direction,
wherein the plurality of active regions comprises a plurality groups, and each of the plurality groups comprises an even number of ones of the plurality of active regions, and
wherein each of the plurality of bottom source/drain regions is overlapped by a respective one of the plurality groups of the plurality of active regions.

15. The integrated circuit device of claim 9, wherein the first active region is a first one of a plurality of active regions, the second active region is a second one of the plurality of active regions, and the plurality of active regions are spaced apart from each in the first direction,
wherein the plurality of active regions further comprise a third active region and a fourth active region, and
wherein the third active region and the fourth active region comprise a first portion and a second portion of a single active region, respectively, and the single active region further comprises a connecting portion that is between the third active region and the fourth active region and contacts both the third active region and the fourth active region.

16. The integrated circuit device of claim 9, wherein the first active region is a first one of a plurality of active regions, the second active region is a second one of the plurality of active regions, and the plurality of active regions are spaced apart from each in the first direction, and
wherein the plurality of active regions further comprise a third active region and a fourth active region,
wherein the third active region comprises a first main portion longitudinally extending in a second direction that is different from the first direction and a first protruding portion protruding from the first main portion toward the fourth active region, and wherein the fourth active region comprises a second main portion longitudinally extending in the second direction and a second protruding portion protruding from the second main portion toward the third active region.

17. An integrated circuit device comprising:
a plurality of active regions comprising a first pair of active regions and a second pair of active regions,
wherein the first pair of active regions are spaced apart from each other in a first direction, and the second pair of active regions are spaced apart from each other in the first direction,
wherein the first pair of active regions and the second pair of active regions are spaced apart from each other in a second direction that is different from the first direction, and
wherein each of the first pair of active regions has a linear shape extending longitudinally in the second direction, and
wherein each of the second pair of active regions comprises a main portion having a linear shape extending longitudinally in the second direction and a protruding portion protruding from the main portion.

18. The integrated circuit device of claim 17, wherein the main portions of the second pair of active regions comprise a first portion and a second portion of a single active region, and the protruding portions of the second pair of active regions comprise a connecting portion that is between the main portions of the second pair of active regions and contact the main portions of the second pair of active regions.

19. The integrated circuit device of claim 17, wherein the first pair of active regions are spaced apart from each other by a first distance in the first direction, and the main portions of the second pair of active regions are spaced apart from each other by the first distance in the first direction.

20. The integrated circuit device of claim 1 further comprising:
an insulating layer on the substrate, wherein the first pair of active regions are in the insulating layer, and the insulating layer contacts a side of the second active region of the first pair of active regions; and
a gate structure on the substrate, wherein the gate structure separates a side of the first active region of the first pair of active regions from the insulating layer.

* * * * *